(12) United States Patent
Yanagisawa

(10) Patent No.: US 9,151,910 B2
(45) Date of Patent: Oct. 6, 2015

(54) OPTICAL MODULE AND METHOD FOR MANUFACTURING OPTICAL MODULE

(71) Applicant: Shinko Electric Industries Co., LTD., Nagano-ken (JP)

(72) Inventor: Kenji Yanagisawa, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 89 days.

(21) Appl. No.: 13/912,267

(22) Filed: Jun. 7, 2013

(65) Prior Publication Data

US 2013/0330049 A1    Dec. 12, 2013

(30) Foreign Application Priority Data

Jun. 11, 2012   (JP) ................................. 2012-132078

(51) Int. Cl.
*G02B 6/36*    (2006.01)
*G02B 6/42*    (2006.01)

(52) U.S. Cl.
CPC ............... *G02B 6/42* (2013.01); *G02B 6/4214* (2013.01); *G02B 6/428* (2013.01); *G02B 6/4224* (2013.01); *G02B 6/4249* (2013.01)

(58) Field of Classification Search
USPC .................................................... 385/88–92
See application file for complete search history.

(56) References Cited

U.S. PATENT DOCUMENTS

2001/0041034 A1* 11/2001 Sasaki et al. .................... 385/88
2010/0215325 A1* 8/2010 Tamura et al. .................. 385/89

FOREIGN PATENT DOCUMENTS

JP    2009-175418 A    8/2009
JP    2011-242706 A    12/2011

* cited by examiner

*Primary Examiner* — Eric Wong
(74) *Attorney, Agent, or Firm* — Wolf, Greenfield & Sacks, P.C.

(57) ABSTRACT

An optical module is provided with a case, which includes an accommodation portion, optical elements, optical waveguide cores, a clad layer, and an optical path changing unit. The optical elements are accommodated in and fixed to the accommodation portion. The optical elements have optical axis centers. The optical waveguide cores are respectively formed at positions corresponding to the planar positions of the optical axis centers. The clad layer surrounds the optical waveguide cores. The clad layer and the optical waveguide cores form an optical waveguide. The optical waveguide is stacked on a wiring substrate including a wiring pattern to which electrode terminals of the optical elements are connected, and the case is mounted on the wiring substrate. The optical path changing unit is formed at a position corresponding to the planar positions of the optical axis centers and faces the optical waveguide at a predetermined angle.

6 Claims, 20 Drawing Sheets

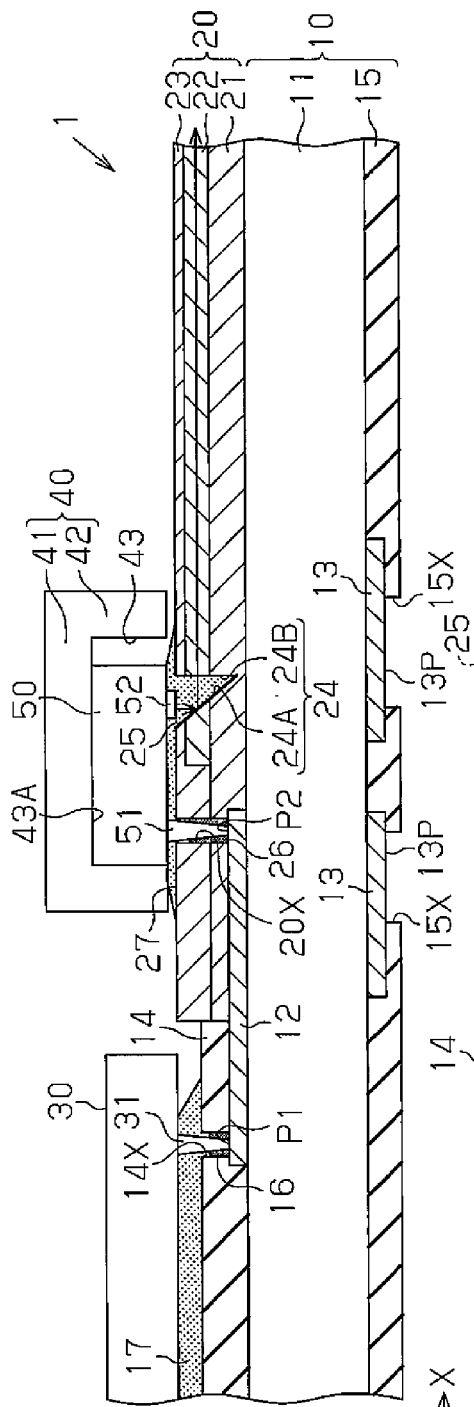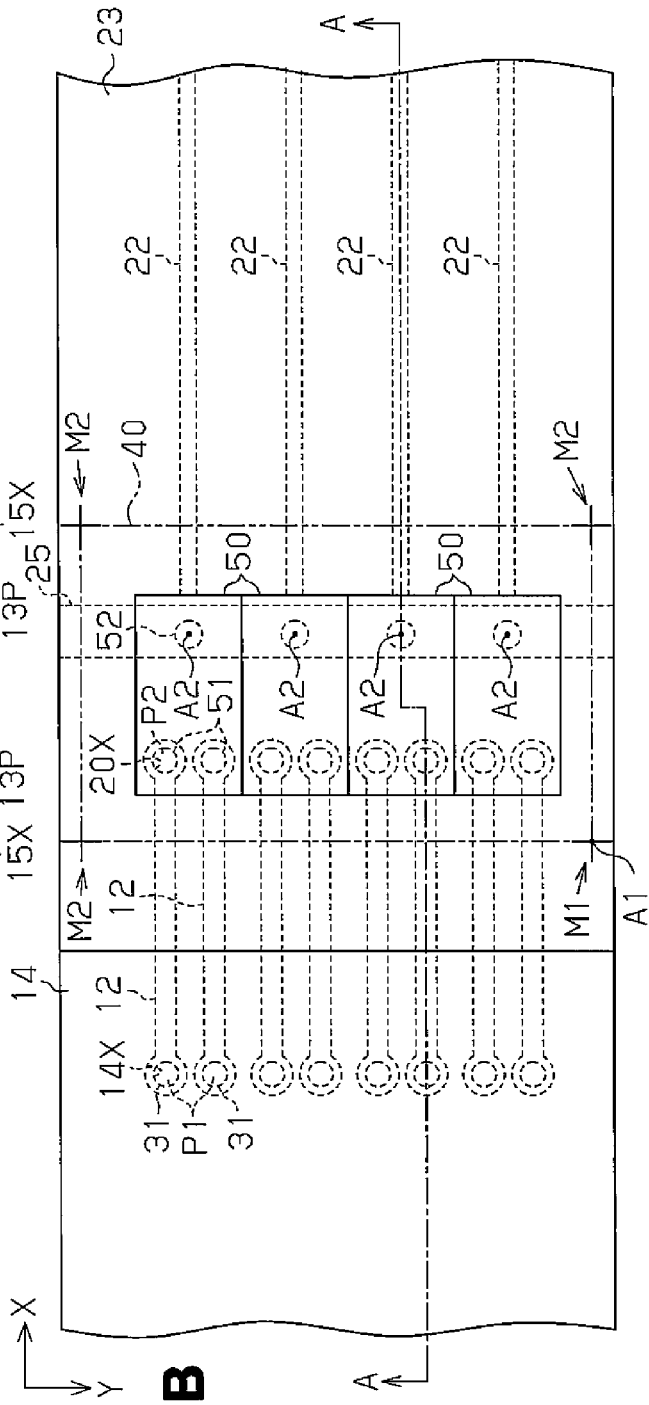

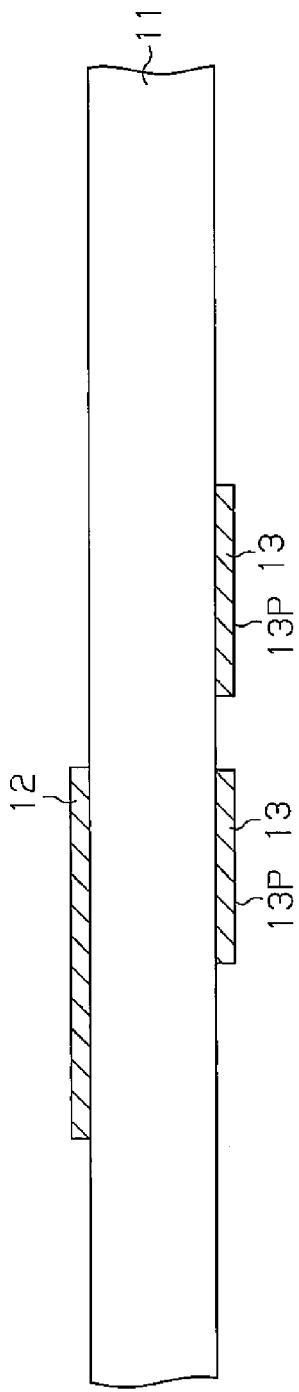
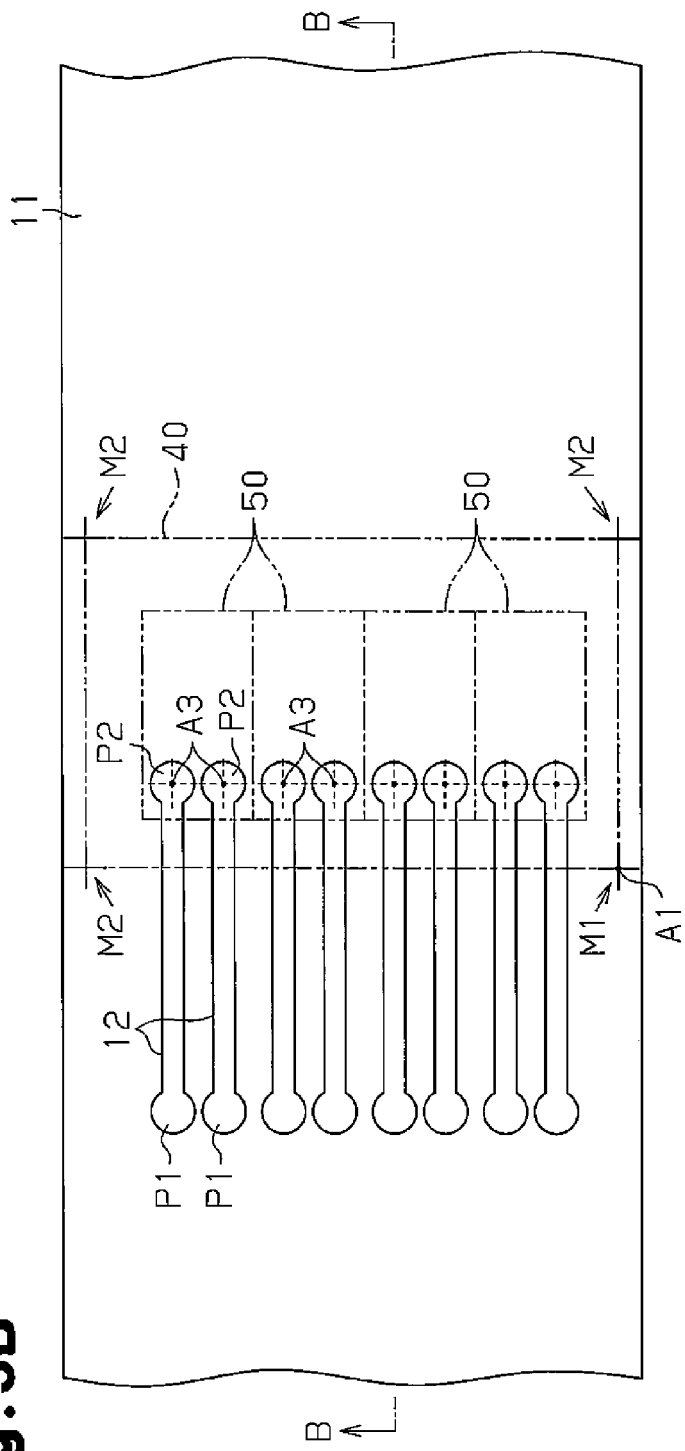
Fig.5A
Fig.5B

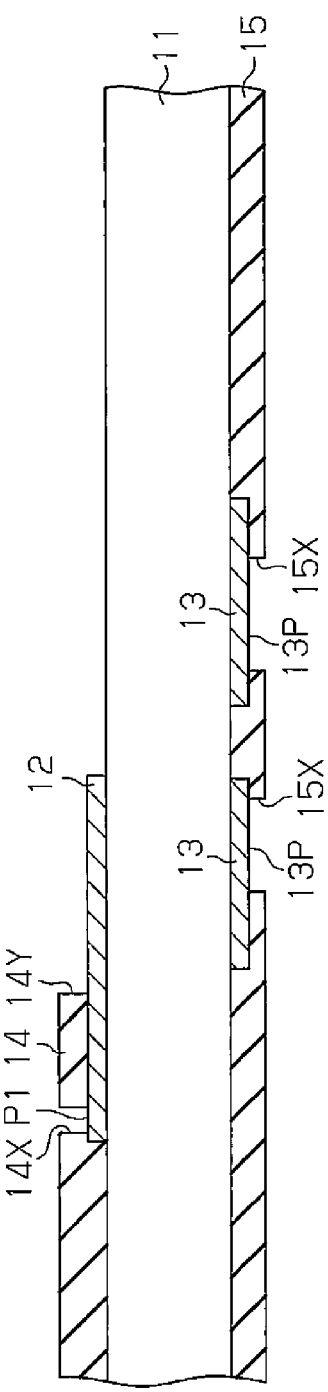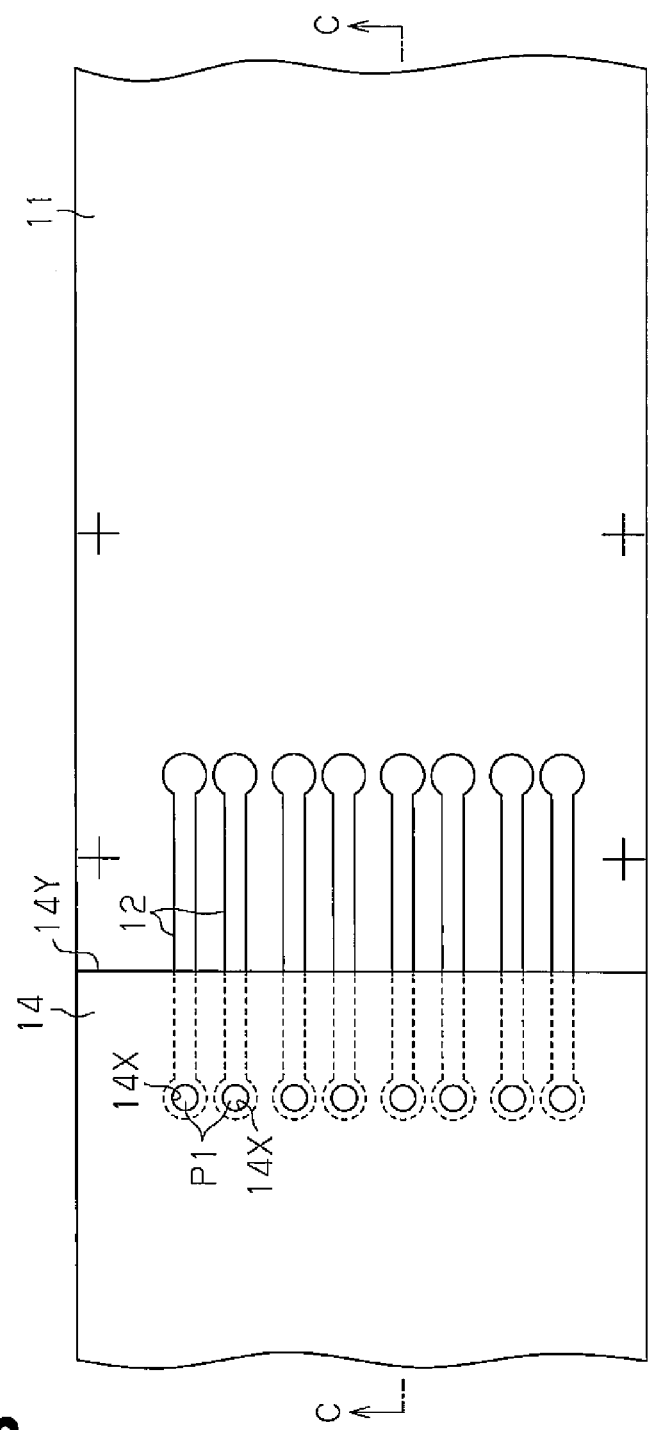
Fig. 6A
Fig. 6B

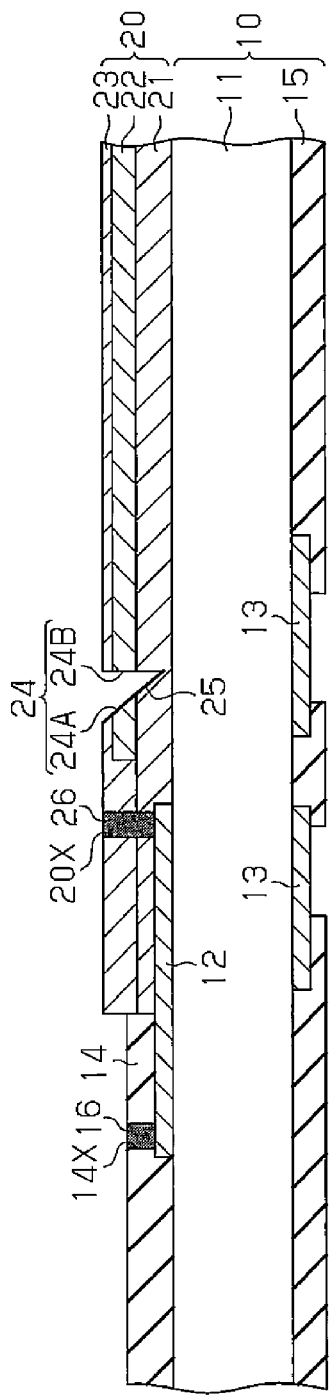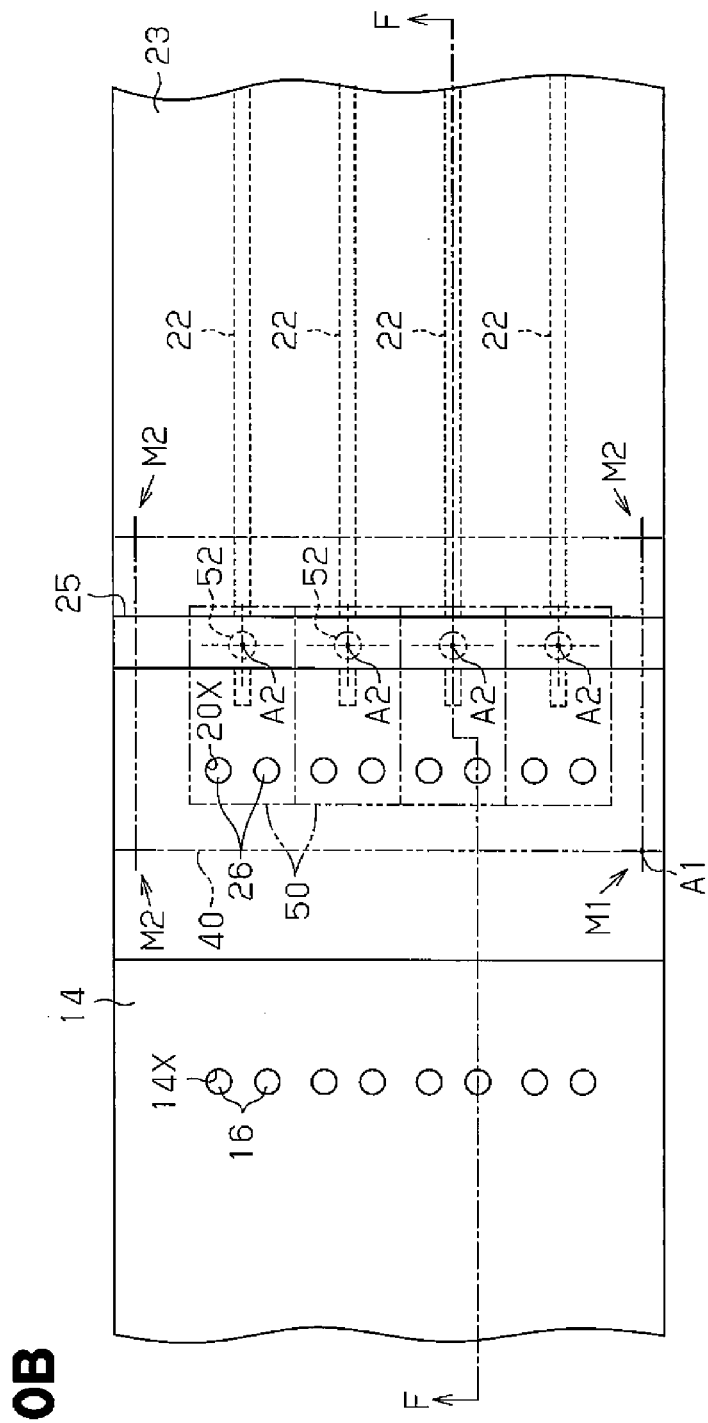
Fig.10A
Fig.10B

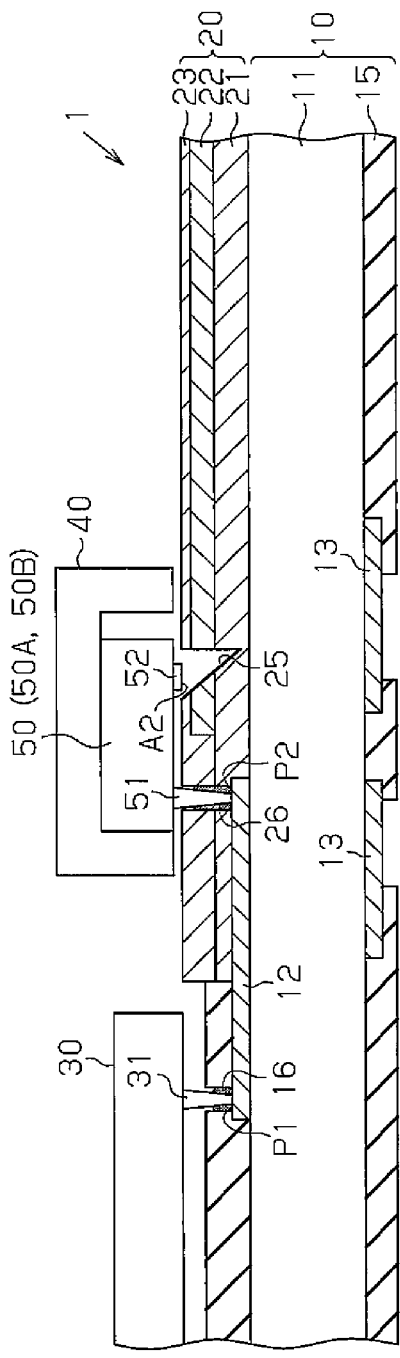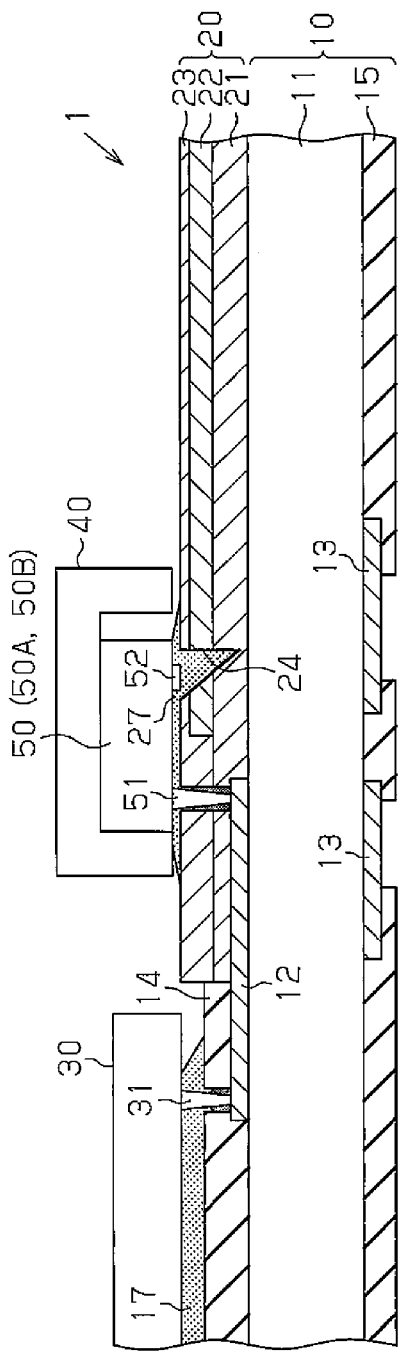

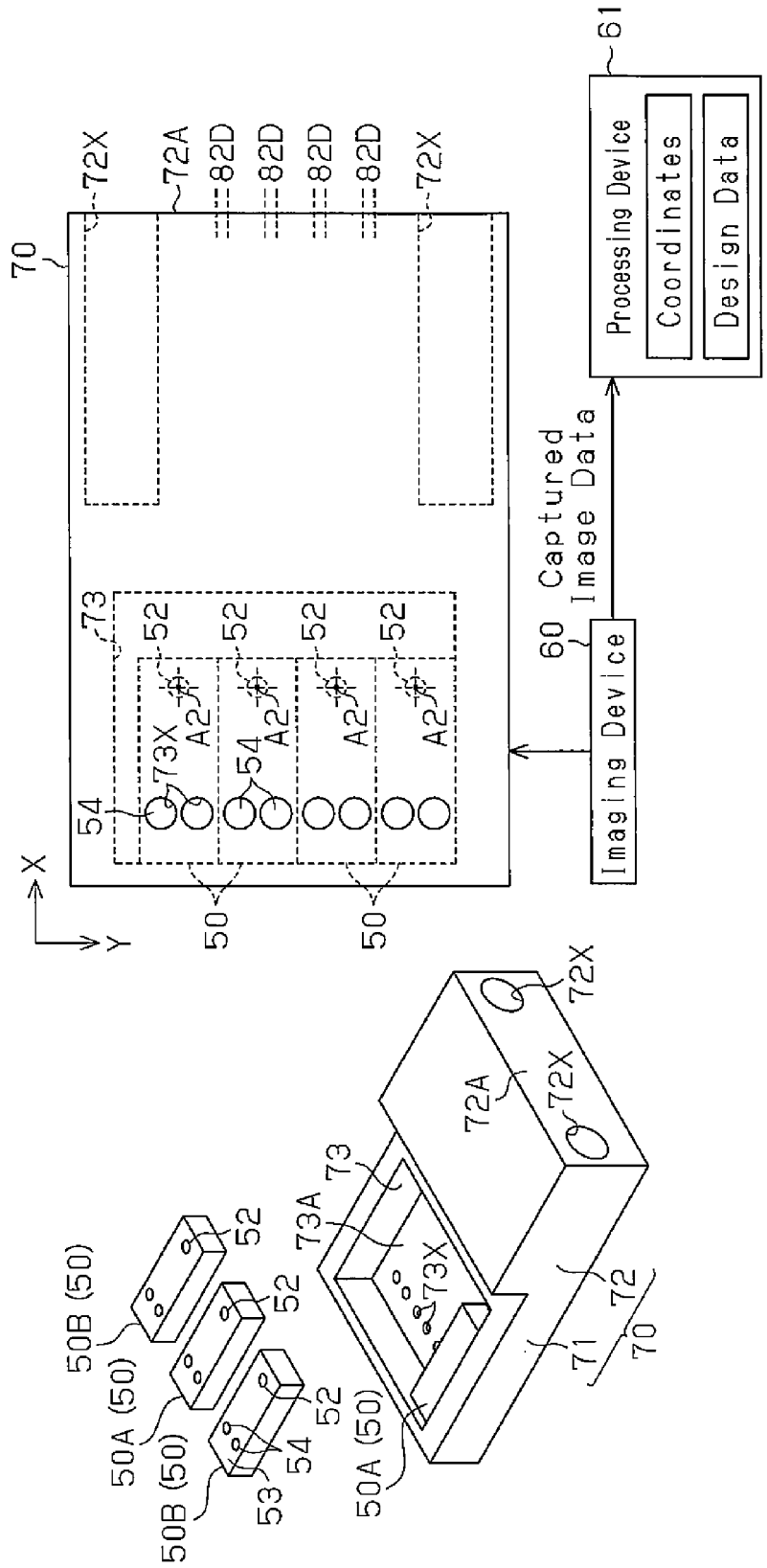

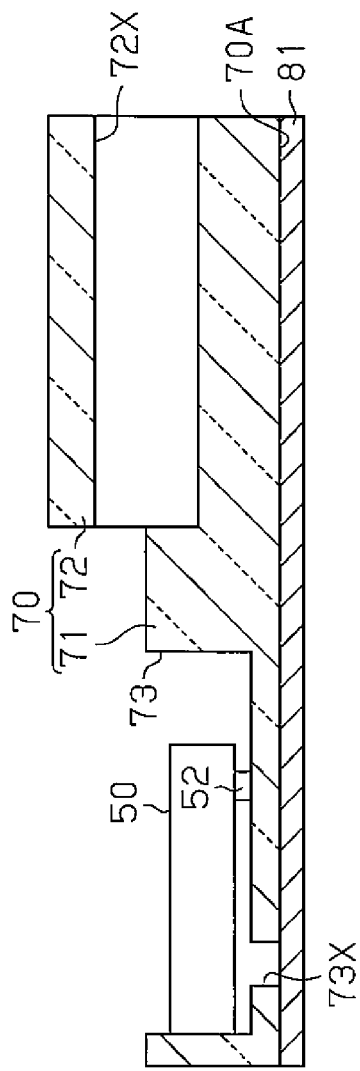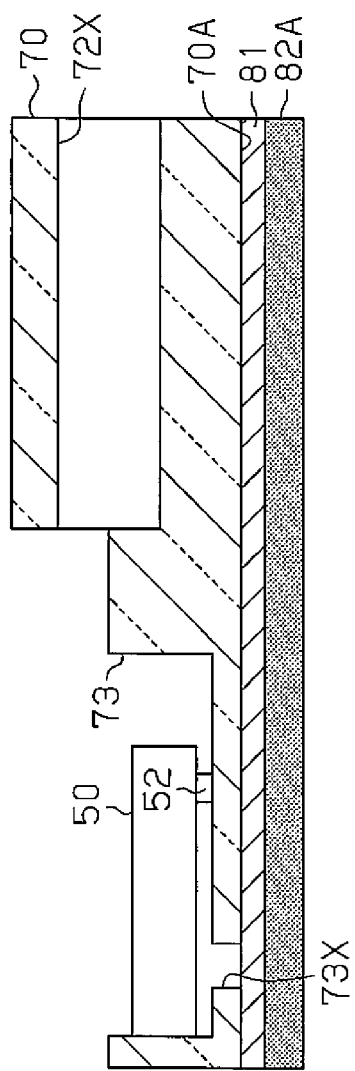
Fig.16A
Fig.16B

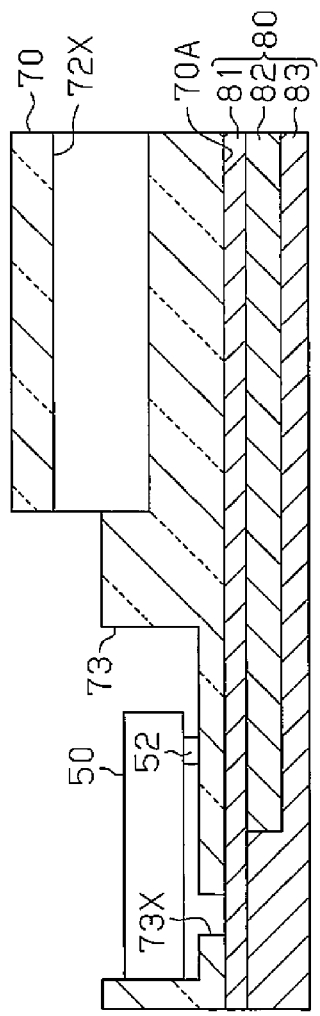
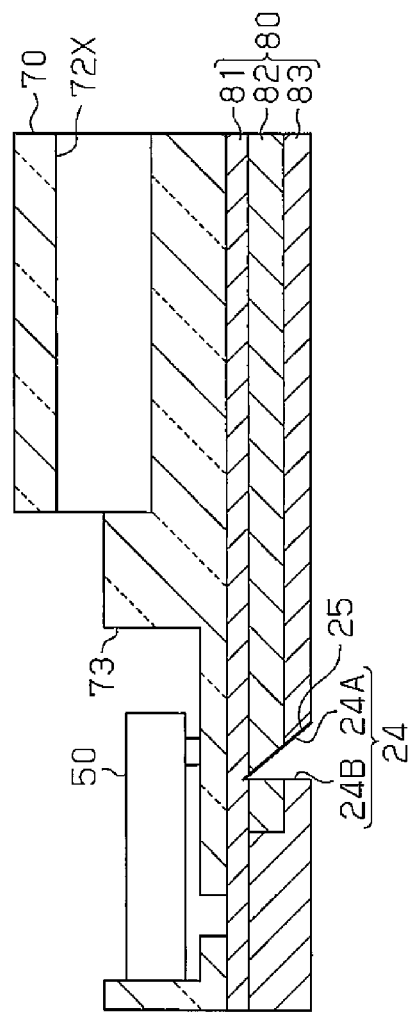
Fig.18A
Fig.18B

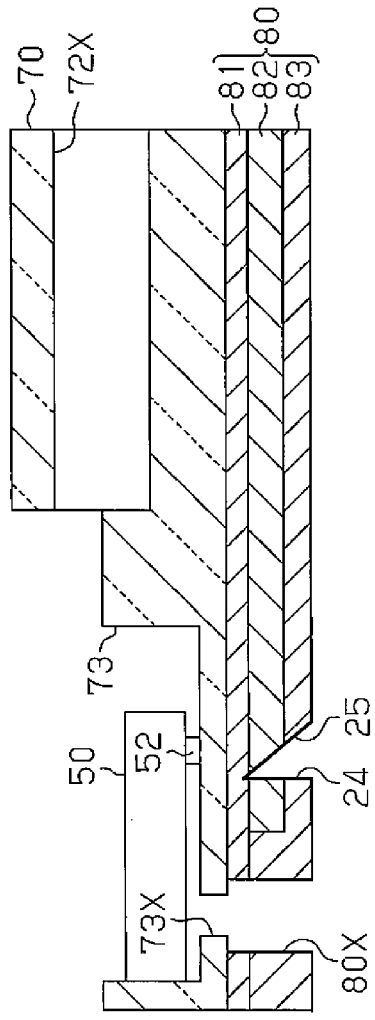
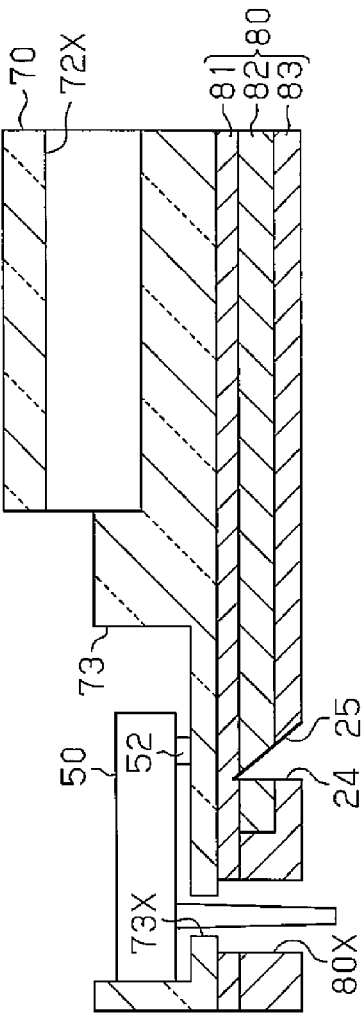
Fig. 19A
Fig. 19B

OPTICAL MODULE AND METHOD FOR MANUFACTURING OPTICAL MODULE

CROSS-REFERENCE TO RELATED APPLICATIONS

This application is based upon and claims the benefit of priority from prior Japanese Patent Application No. 2012-132078, filed on Jun. 11, 2012, the entire contents of which are incorporated herein by reference.

BACKGROUND ART

The present invention relates to an optical module and a method for manufacturing an optical module.

High-speed optical communication, which uses optical signals instead of electric signals, involves an optical module that converts electric signals to optical signals and optical signals to electric signals. An optical module basically includes a light emitting element and a light receiving element that are arranged on an optical transmission medium, such as an optical waveguide. The light emitting element, which may be a semiconductor laser, converts electric signals to optical signals. The light receiving element, which may be a photodiode, converts optical signals to electric signals (refer to, for example, Japanese Laid-Open Patent Publication Nos. 2011-242706 and 2009-175418).

FIG. 21 shows a referential example of optical coupling between a light emitting element and an optical waveguide. An optical waveguide 91, which is arranged on a substrate 90, includes one end surface that is inclined at 45 degrees with respect to a surface 90A of the substrate 90. A reflective mirror 92 is formed on the inclined end surface of the optical waveguide 91. Light emitted from a light emitting element 93 is reflected by the reflective mirror 92 into the optical waveguide 91.

To enable such optical coupling in the referential example, there is a need to accurately align the optical axis of the light emitting element 93, the point of reflection on the reflective mirror 92, and the position of the optical waveguide 91 at which the reflected light from the reflective mirror 92 enters the waveguide. Such alignment is achieved through, for example, active alignment. Active alignment involves measurement of the amount of light emitted from an output end of the optical waveguide 91 during movement of the reflective mirror 92 and the optical waveguide 91 (or specifically the substrate 90) when light is output from the light emitting element 93. The light emitting element 93 and the substrate 90 are then fixed at positions corresponding to the maximum amount of light emitted from the output terminal of the optical waveguide 91.

However, an information communication device or an information processor includes a large number of channels that carry optical signals. Thus, when active alignment is performed for each channel of such a device, a great amount of time is consumed.

SUMMARY

One aspect of the present invention is an optical module provided with a case including an accommodation portion. A plurality of optical elements are accommodated in and fixed to the accommodation portion of the case. The optical elements have optical axis centers. A plurality of optical waveguide cores are respectively formed at positions corresponding to the planar positions of the optical axis centers. A clad layer surrounds the optical waveguide cores. The clad layer and the optical waveguide cores form an optical waveguide. A wiring substrate includes a wiring pattern to which electrode terminals of the optical elements are connected. The optical waveguide is stacked on the wiring substrate. The case is mounted on the wiring substrate on which the optical waveguide has been stacked. An optical path changing unit is formed at a position corresponding to the planar positions of the optical axis centers. The optical path changing unit faces the optical waveguide at a predetermined angle.

BRIEF DESCRIPTION OF THE DRAWINGS

The invention, together with objects and advantages thereof, may best be understood by reference to the following description of the presently preferred embodiments together with the accompanying drawings in which:

FIG. 1A is a schematic cross-sectional view of an optical module according to a first embodiment taken along line A-A in FIG. 1B, and FIG. 1B is a schematic plan view of the optical module of FIG. 1A viewed from above in which some portions, such as electronic components and underfill resin, are not shown;

FIG. 5A is a schematic cross-sectional view illustrating the method for manufacturing the optical module of the first embodiment taken along line B-B in FIG. 5B, and FIG. 5B is a schematic plan view illustrating the method;

FIG. 6A is a schematic cross-sectional view illustrating the method for manufacturing the optical module of the first embodiment taken along line C-C in FIG. 6B, and FIG. 6B is a schematic plan view illustrating the method;

FIG. 10A is a schematic cross-sectional view taken along line F-F in FIG. 10B illustrating the method for manufacturing the optical module of the first embodiment, and FIG. 10B is a schematic plan view of the optical module of FIG. 10A;

FIGS. 11A and 11B are schematic cross-sectional views illustrating the method for manufacturing the optical module of the first embodiment taken along line F-F in FIG. 10B;

FIGS. 15A and 15B are diagrams illustrating a method for manufacturing the optical connector according to the second embodiment;

FIGS. 16A and 16B are schematic cross-sectional views illustrating the method for manufacturing the optical connector of the second embodiment taken along line G-G in FIG. 12B;

FIGS. 18A and 18B and FIGS. 19A and 19B are schematic cross-sectional views illustrating the method for manufacturing the optical connector of the second embodiment taken along line H-H in FIG. 17B;

DETAILED DESCRIPTION OF EMBODIMENTS

Figure 2:
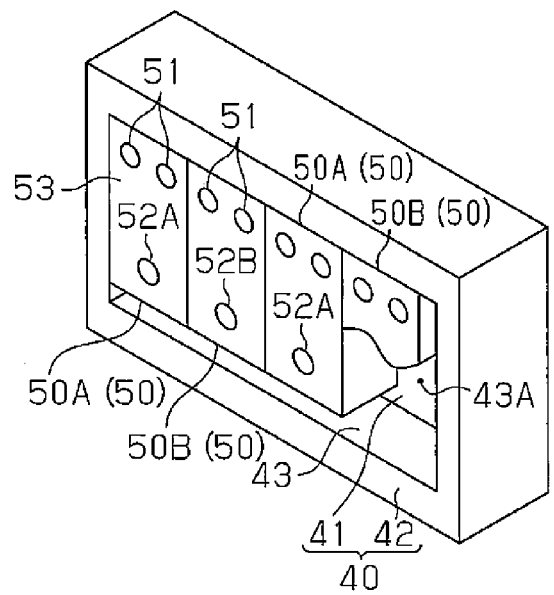
FIG. 2 is a schematic perspective view of a case to which optical elements are fixed.

Embodiments will now be described with reference to the attached drawings. To facilitate understanding, the drawings do not depict actual scale. Further, the cross-sectional views may not include hatching lines.

An optical module according to a first embodiment will now be described with reference to FIG. 1A to FIG. 11B.

As shown in FIGS. 1A and 1B, an optical module 1 includes a wiring substrate 10, an optical waveguide 20, an electronic component 30, a case 40, and a plurality of optical elements 50 accommodated in the case 40. The optical elements 50 may be light emitting elements, such as surface-emitting semiconductor lasers (vertical cavity surface emitting lasers, or VCSELs) or light emitting diodes (LEDs). The optical elements 50 may also be light receiving elements, such as photodiodes (PD) or avalanche photodiodes (APDs). The electronic component 30 may be, for example, an integrated circuit (IC) chip, such as a driver, which drives the optical elements 50 (light emitting elements), an IC chip incorporating a digital signal processor (DSP), or an amplifier for processing optical signals output from the optical elements 50 (light receiving elements).

The wiring substrate 10 includes a substrate body 11, a wiring pattern 12 serving as an uppermost layer, a wiring pattern 13 serving as a lowermost layer, and solder resist layers 14 and 15.

The substrate body 11 only needs to include the wiring patterns 12 and 13 as its outermost surfaces, which are electrically connected to each other through the substrate. The substrate body 11 may or may not include internal wiring layers. When the substrate body 11 includes internal wiring layers, the wiring layers are stacked so that inter-layer insulating layers are formed between the wiring layers. In this structure, the wiring patterns 12 and 13 are electrically connected to each other through vias formed in the wiring layers and the inter-layer insulating layers. The substrate body 11 may be, for example, a buildup substrate with a core substrate, or a coreless substrate without a core substrate.

The wiring pattern 12 is arranged on or above the mounting surface on which the electronic component 30 and the optical elements 50 are mounted (upper surface in FIG. 1A). The wiring pattern 12 includes connecting pads P1, which are electrically connected to electrode terminals 31 of the electronic component 30, and connecting pads P2, which are electrically connected to electrode terminals 51 of the optical elements 50. The wiring pattern 12 has a thickness of, for example, about 15 μm to about 35 μm. The wiring pattern 12 is formed from, for example, copper (Cu) or a copper alloy.

The wiring pattern 13 is arranged on or below the surface opposite to the mounting surface (lower surface in FIG. 1A). The wiring pattern 13 includes external connecting pads 13P. The wiring pattern 13 has a thickness of, for example, about 15 μm to about 35 μm. The wiring pattern 13 may be formed from, for example, copper or a copper alloy.

The solder resist layer 14 is formed on the upper surface of the substrate body 11 to cover the wiring pattern 12. The solder resist layer 14 has openings 14X, which allow parts of the wiring pattern 12 to be exposed and function as the connecting pads P1. Solder portions 16, which electrically connect the connecting pads P1 and the electrode terminals 31 of the electronic component 30, are formed on the connecting pads P1. In one example, the parts of the wiring pattern 12 exposed through the openings 14X may be subjected to organic solderbility preservative (OSP) when necessary to form an OSP film on these parts. The solder portions 16 may then be formed on the OSP film. In another example, a metal layer may be formed on the parts of the wiring pattern 12 exposed through the openings 14X. The solder portions 16 may then be formed on the metal layer. The metal layer may be, for example, a gold (Au) layer. The metal layer may be an Ni—Au laminate of a Ni layer and an Au layer stacked in this order on the wiring pattern 12, or an Ni—Pd—Au alternating laminate of a Ni layer, a Pd layer, and an Au layer stacked in this order on the wiring pattern 12.

In the unrestrictive example shown in FIG. 1B, each opening 14X and each connecting pad P1 are circular as viewed from above, and have a diameter of, for example, about 50 μm to about 200 μm. The openings 14X and the connecting pads P1 are arranged along a straight line in the Y-direction as viewed from above. The thickness from the upper surface of the substrate body 11 to the upper surface of the solder resist layer 14 may be, for example, about 10 μm to about 100 μm. The solder resist layer 14 may be formed from, for example, epoxy or acrylic insulating resin.

As shown in FIG. 1A, the solder resist layer 15 is formed on the lower surface of the substrate body 11 to cover the wiring pattern 13. The solder resist layer 15 has openings 15X, which allow parts of the wiring pattern 13 to be exposed and function as the external connecting pads 13P. The external connecting pads 13P are connected to external connecting terminals, such as solder balls or lead pins, which are used to mount the wiring substrate 10 onto, for example, a motherboard. In one example, the parts of the wiring pattern 13 exposed through the openings 15X may be subjected to OSP to form an OSP film, to which the external connecting terminals may be connected. Alternatively, a metal layer may be formed on the parts of the wiring pattern 13 exposed through the openings 15X. The external connecting terminals may then be connected to the metal layer. The metal layer may be, for example, an Au layer. The metal layer may be an Ni—Au alternating laminate or an Ni—Pd—Au alternating laminate. The parts of the wiring pattern 13 exposed though the openings 15X (or the metal layer or the OSP formed on the wiring pattern 13) may function as the external connecting terminals.

Each opening 15X and each external connecting pad 13P are, for example, circular as viewed from above, and have a diameter of, for example, about 200 μm to about 300 μm. The thickness from the lower surface of the substrate body 11 to the lower surface of the solder resist layer 15 may be, for example, about 20 μm to about 40 μm. The solder resist layer 15 may be formed from, for example, epoxy or acrylic insulating resin.

The electronic component 30 includes electrode terminals 31 arranged on one surface (lower surface in FIG. 1A). The electronic component 30 is electrically connected to the connecting pads P1 of the wiring substrate 10 with the electrode terminals 31 and the solder portions 16. More specifically, the electronic component 30 is flip-chip-mounted onto the wiring substrate 10. The electrode terminals 31 may be formed from, for example, gold bumps or solder bumps. The solder bumps may be formed from, for example, a lead (Pb) alloy, an alloy of tin (Sn) and copper, an alloy of tin and silver (Ag), and an alloy of tin, silver, and copper.

An underfill resin 17 is filled between the wiring substrate 10 and the electronic component 30. The underfill resin 17 increases the coupling strength between the electrode terminals 31 of the electronic component 30 and the connecting pads P1 of the wiring substrate 10. The underfill resin 17 fills the gap between the upper surface of the wiring substrate 10 (solder resist layer 14) and the lower surface of the electronic component 30. The underfill resin 17 may be, for example, epoxy insulating resin.

The optical waveguide 20 is formed on the upper surface of the substrate body 11 of the wiring substrate 10 in areas where the solder resist layer 14 is not formed. The optical waveguide 20 includes a first clad layer 21, cores 22, and a second clad layer 23.

The first clad layer 21 is formed on the upper surface of the substrate body 11 in areas where the solder resist layer 14 is not formed. The cores 22, which carry optical signals, are formed on the first clad layer 21. The second clad layer 23 is formed on the first clad layer 21 to cover the cores 22. As described above, the optical waveguide 20 includes the first clad layer 21, the cores 22, and the second clad layer 23 stacked in this order on the upper surface of the substrate body 11. The cores 22 are surrounded by the first clad layer 21 and the second clad layer 23.

The first and second clad layers 21 and 23 and the cores 22 may be formed basically from the same material. For example, the first and second clad layers 21 and 23 and the cores 22 may be formed from resin that is transparent to wavelengths of light used by the optical elements 50. More specifically, the material may be acrylic resin, such as polymethyl methacrylate (PMMA), epoxy resin, or silicone resin. To allow optical signals to be transmitted only within the cores 22, the cores 22 are formed from a material having a higher refractive index than the material used for the first and second clad layers 21 and 23 formed on the upper and lower surfaces of the cores 22. Although the difference in refractive index between the cores 22, the first clad layer 21, and the second clad layer 23 is not limited to specific values, it may preferably be, for example, about 0.3% to about 5.5%, and more preferably about 0.8% to about 2.2%.

As shown in FIG. 1B, a plurality of (e.g., four) cores 22, the number of which conforms to the number of the optical elements 50 (more specifically, channels) arranged in the case 40, are arranged in the Y-direction. Each core 22 forms a strip as viewed from above and extends linearly in the X-direction. Each core 22 is formed at a planar position corresponding to the position of a light emitting-receiving unit 52 of the corresponding optical element 50, which is fixed to the case 40. More specifically, each core 22 is formed at a planar position corresponding to the position (XY coordinates) of the optical axis center A2 of the corresponding optical element 50 when a certain point of the case (e.g., corner A1 of the case 40) is set as a reference point (e.g., point of origin). More specifically, each core 22 is formed at a planar position corresponding to the coordinates (planar position) of the optical axis center A2 of the corresponding optical element 50, and the intersecting point of the alignment mark M1 that is aligned with the corner A1 is set as the reference point. The planar position refers to a position in the directions defining one plane (X-direction and Y-direction in the drawing) perpendicular to the stacking direction (thickness direction) of the optical waveguide 20. In particular, the position of each core 22 in the Y-direction, which is the direction in which the optical elements 50 are arranged, is determined by the coordinates of the optical axis center A2 of the corresponding optical element 50. The optical axis center A2 refers to a light emission point when the optical element 50 is a light emitting element, and refers to a center point of a light receiving area when the optical element 50 is a light receiving element.

The thickness of the first clad layer 21 shown in FIG. 1A, or more specifically the thickness of the first clad layer 21 on the wiring pattern 12, may be, for example, about 10 μm to about 15 μm. The thickness of each core 22 may be, for example, about 30 μm to about 80 μm. The pattern width of each core 22 may be, for example, about 300 μm to about 500 μm. The pitch of the cores 22 may be, for example, about 125 μm to about 300 μm. The thickness of the second clad layer 23 formed on the cores 22 may be, for example, about 30 μm to about 80 μm.

The optical waveguide 20 includes a groove 24, which allows the cores 22 to be exposed. The groove 24 extends from the upper surface of the second clad layer 23 through the cores 22 and extends to a middle position in the thickness direction of the first clad layer 21. The second clad layer 23 and the cores 22 are separated by the groove 24. The groove 24 includes an inclined surface 24A, which deflects or changes an optical path of incident light by 90 degrees, and a side wall surface 24B, which intersects with the inclined surface 24A. For example, the side wall surface 24B of the groove 24 may be a vertical surface perpendicular to the direction in which the optical waveguide 20 (cores 22) extends. The inclined surface 24A is inclined by a predetermined angle (e.g., 45 degrees) with respect to the direction in which the optical waveguide 20 (cores 22) extends. More specifically, the inclined surface 24A is inclined by 45 degrees with respect to the direction in which light travels through each core 22. The groove 24 has a substantially regular triangular cross-section. The side wall surface 24B of the groove 24 does not have to be vertical and may be, for example, slightly inclined inward from the optical waveguide 20 (to the left in the drawing). In this case, the groove 24 is substantially V-shaped.

A reflective mirror 25, which deflects or changes an optical path of incident light by 90 degrees, is formed on the inclined surface 24A. The reflective mirror 25 is formed from, for example, gold (Au), silver (Ag), or aluminum (Al), which has high reflectivity of light.

As shown in FIG. 1B, the reflective mirror 25 extends in the Y-direction and forms a strip-shaped groove perpendicular to the cores 22. The reflective mirror 25 faces the light emitting-receiving unit 52 of each optical element 50, which is mounted on the optical waveguide 20. For example, the reflective mirror 25 is formed on a planar position determined by the coordinates of the optical axis center A2 of each optical element 50, with the corner A1 of the case 40 being set as the reference point. More specifically, the reflective mirror 25 is formed at a planar position determined by the coordinates (planar position) of the optical axis center A2 of each optical element 50 when the intersecting point of the alignment mark M1 is set as the reference point.

As shown in FIG. 1A, the optical waveguide 20 includes openings 20X, which allow parts of the wiring pattern 12 to be exposed and function as the connecting pads P2. Solder portions 26, which electrically connect the connecting pads P2 and the electrode terminals 51 of the optical elements 50, are formed on the connecting pads P2. When necessary, the parts of the wiring pattern 12 exposed through the openings 20X may be subjected to organic solderbility preservative (OSP) to form an OSP film on these parts. The solder portions 26 may then be formed on the OSP film. A metal layer may be formed on the parts of the wiring pattern 12 exposed through the openings 20X. The solder portions 26 may then be formed on the metal layer. The metal layer may be, for example, an Au layer, an Ni—Au layer, or an Ni—Pd—Au layer.

To mount the case 40 onto the wiring substrate 10, the optical elements 50 fixed in the case 40 are arranged on the wiring substrate 10 on which the optical waveguide 20 has been stacked. As shown in FIG. 2, the case 40 includes a plate-like bottom wall 41, which is substantially rectangular as viewed from above, and a frame-shaped side wall 42, which is formed integrally with the edge of the bottom wall 41 and extends upright from the edge. The case 40 is a box having a closed bottom. The case 40 has a recess (accommodation portion) 43, which is defined by the bottom wall 41 and the side wall 42. A plurality of (e.g., four) optical elements 50 are arranged in the recess 43. For example, each optical element 50, accommodated in the recess 43, is fixed to a bottom surface 43A of the recess 43 with, for example, solder paste or adhesive resin. Insulating adhesive resin or underfill resin may be filled in the recess 43, or specifically in the gap between each optical element 50 and the case 40. The optical elements 50 are accommodated in the recess 43 in a manner that their surfaces 53 with the electrode terminals 51 are exposed from the opening of the recess 43. The adjacent optical elements 50 are in close contact with each other. In the present embodiment, two single-channel optical elements 50 (light emitting elements 50A) each having a single light emitting unit 52A, and two single-channel optical elements 50 (light receiving elements 50B) each having a single light receiving unit 52B are accommodated in the recess 43. More specifically, the single-channel light emitting elements 50A and the single-channel light receiving elements 50B are arranged alternately in the case 40. Each of the single-channel light emitting elements 50A and the single-channel light receiving elements 50B (collectively referred to as optical elements 50) includes two electrode terminals 51 and one light emitting unit 52A or one light receiving unit 52B. One of the two electrode terminals 51 is connected to a cathode electrode (not shown) of the optical element 50, and the other electrode terminal 51 is connected to an anode terminal (not shown) of the optical element 50. In this specification, the light emitting unit 52A and the light receiving unit 52B may be collectively referred to as the "light emitting-receiving unit 52."

The case 40 may be formed from a material that allows for accommodation of the optical elements 50. The case 40 may be formed from, for example, a material having a heat resistance of about 300° C. For example, the case 40 may be formed from a semiconductor material or a glass material. In the present embodiment, the case 40 is formed from the same semiconductor material as the base material for the optical elements 50 (e.g., silicon). This eliminates the difference in thermal expansion coefficient between the case 40 and the optical elements 50 accommodated in the case 40, and thus reduces stress caused by heat.

Each optical element 50 may be a multiple-channel optical element including a multiple-channel light emitting unit or light receiving unit. The optical elements 50 may all be light emitting elements, or may all be light receiving elements.

As shown in FIG. 1A, the case 40 is mounted on the wiring substrate 10 on which the optical waveguide 20 is stacked and formed integrally. The optical elements 50 fixed to the case 40 are electrically connected to the connecting pads P2 of the wiring substrate 10 with the electrode terminals 51 and the solder portions 26. This allows the optical elements 50 to be electrically connected to the electronic component 30 with the electrode terminals 51, the wiring pattern 12, and the electrode terminals 31. A single electronic component 30 may be arranged for a single optical element 50, or a single electronic component 30 may be arranged for a plurality of optical elements 50.

Each optical element 50 is mounted on the wiring substrate 10 so that the light emitting-receiving unit 52 faces the reflective mirror 25. More specifically, each optical element 50 fixed to the case 40 is mounted on the wiring substrate 10 in a manner that its light emitting-receiving unit 52 is immediately above the reflective mirror 25.

An underfill resin 27 is filled between the case 40, the optical elements 50 fixed to the case 40, the optical waveguide 20, and the wiring substrate 10. The underfill resin 27 increases the coupling strength between the electrode terminals 51 of the optical elements 50 and the connecting pads P2 of the wiring substrate 10. The underfill resin 27 fills the gap between the upper surface of the optical waveguide 20 (second clad layer 23) and the lower surface of each optical element 50. The underfill resin 27 may be resin that is transparent to wavelengths of light used by the optical elements 50. More specifically, the underfill resin 27 may be the same resin material as that used for the first clad layer 21, the cores 22, and the second clad layer 23.

When the optical element 50 is the light emitting element 50A, light emitted from the optical axis center A2 (emission point) of the light emitting unit 52A enters the opening (groove 24) of the optical waveguide 20 as indicated by an arrow in the drawing. The optical path of the light entering the groove 24 deflects or changes by 90 degrees at the reflective mirror 25 formed on its inclined surface 24A and enters the corresponding core 22 of the optical waveguide 20. The light entering the core 22 travels through the core while undergoing repeated total reflection inside the core 22. When the optical element 50 is the light receiving element 50B, light traveling inside the corresponding core 22 of the optical waveguide 20 is reflected on the reflective mirror 25 and is emitted from the opening (groove 24) of the optical waveguide 20, and enters the optical axis center A2 (center of the light receiving unit 52B) of the light receiving element 50B.

The operation of the optical module 1 will now be described. The cores 22 and the reflective mirror 25 are formed at the planar positions corresponding to the light emitting-receiving units 52 of the optical elements 50, which are fixed to the case 40. More specifically, each core 22 and the reflective mirror 25 are formed at the planar positions determined by the coordinates of the optical axis center A2 of the corresponding optical element 50, and the corner A1 of the case 40 is set as the reference point. More specifically, the alignment mark M1 that is aligned with the corner A1 of the case 40 is set as the reference point. Each core 22 is formed at the position corresponding to the actual position of the optical axis center A2 of the corresponding optical element 50. Thus, if the optical elements 50 are mounted in the case 40 with low alignment accuracy, that is, when the optical elements 50 are mounted at positions deviating from their desirable positions, the cores 22 will be formed at positions corresponding to the deviating positions. Also, if the shape of the case 40 varies or the shape of each optical element 50 varies, the cores 22 will be formed at positions corresponding to the positions of the optical elements 50 deviating due to such variations. With the optical elements 50 mounted on the wiring substrate 10 being fixed to the case 40, the mounting process would not change the relative positions of the corner A1 (reference point) of the case 40 and the optical axis center A2 of each optical element 50. Thus, accurate alignment of the corner A1 of the case 40 with the alignment mark M1 when mounting the optical elements 50 onto the wiring substrate 10 enables accurate alignment of the optical axis centers A2 of all the optical elements 50 fixed to the case 40, the position of the reflective mirror 25, and the positions of the cores 22 arranged in correspondence with the optical elements 50. More specifically, a single alignment performed accurately in when mounting the case 40 onto the wiring substrate 10 enables the large number of optical elements 50 mounted in the case 40 to be aligned accurately with the reflective mirror 25 and the cores 22.

The optical elements 50 accommodated in the case 40 are fixed in the recess 43 in a manner that the adjacent optical elements 50 are in close contact with each other. The light emitting elements 50A and the light receiving elements 50B mounted in the case 40 as in the present example are arranged and fixed in the recess 43 in a manner that the light emitting element and the light receiving element adjacent to each other are in close contact with each other. As described above, the optical elements 50 are fixed to the case 40, and thus the plurality of optical elements 50 and the case 40 are mounted integrally in a single package onto the wiring substrate 10. This structure allows the light emitting elements 50A and the light receiving elements 50B to be mounted in a single package onto the wiring substrate 10. Further, this structure uses a smaller area occupied by the light emitting elements and the light receiving elements than, for example, a structure without the case 40 in which the light emitting elements and the light receiving elements are mounted separately.

Figure 3:
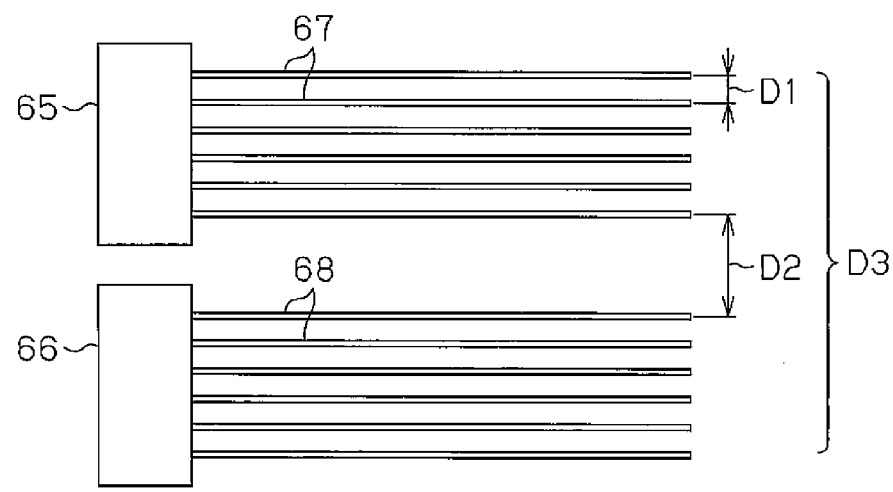
FIG. 3 is a diagram illustrating a referential example of the structure in which a light emitting element and a light receiving element are mounted.

As shown in FIG. 3, as an example, a structure including a six-channel light emitting element 65 and a six-channel light receiving element 66 mounted separately on a wiring substrate will now be described. The light emitting element 65 includes six cores 67, which respectively correspond to six light emitting units arranged in the light emitting element 65. The light receiving element 66 includes six cores 68, which respectively correspond to six light receiving units arranged in the light receiving element 66. A distance D1 between the cores 67 and a distance D1 between the cores 68 are, for example, 250 μm. To enable the light emitting element 65 and the light receiving element 66 to be mounted separately, the light emitting element 65 and the light receiving element 66 need to be spaced from each other to avoid interference between jigs for the different elements during mounting. This necessitates a larger distance D2 between the adjacent cores 67 and 68 than the distance D1 to avoid such interference between the jigs. In this case, a total distance D3 occupied by the cores 67 and 68 is greater than the sum of the distances D1 between the cores 67 and between the cores 68. This drawback also occurs when a single-channel light emitting element and a single-channel light receiving element are mounted separately.

To overcome this drawback, the light emitting elements 50A and the light receiving elements 50B are fixed to the case 40 in the present embodiment. Thus, the light emitting elements 50A and the light receiving elements 50B are mounted in a single package onto the wiring substrate 10. This eliminates the need to design the structure that avoids such interference of the jigs during mounting. Further, the light emitting elements 50A and the light receiving elements 50B are allowed to be arranged in close contact with each other and fixed in the case 40. This decreases the entire width of the cores 22.

A method for manufacturing the optical module 1 will now be described.

Figure 4A:
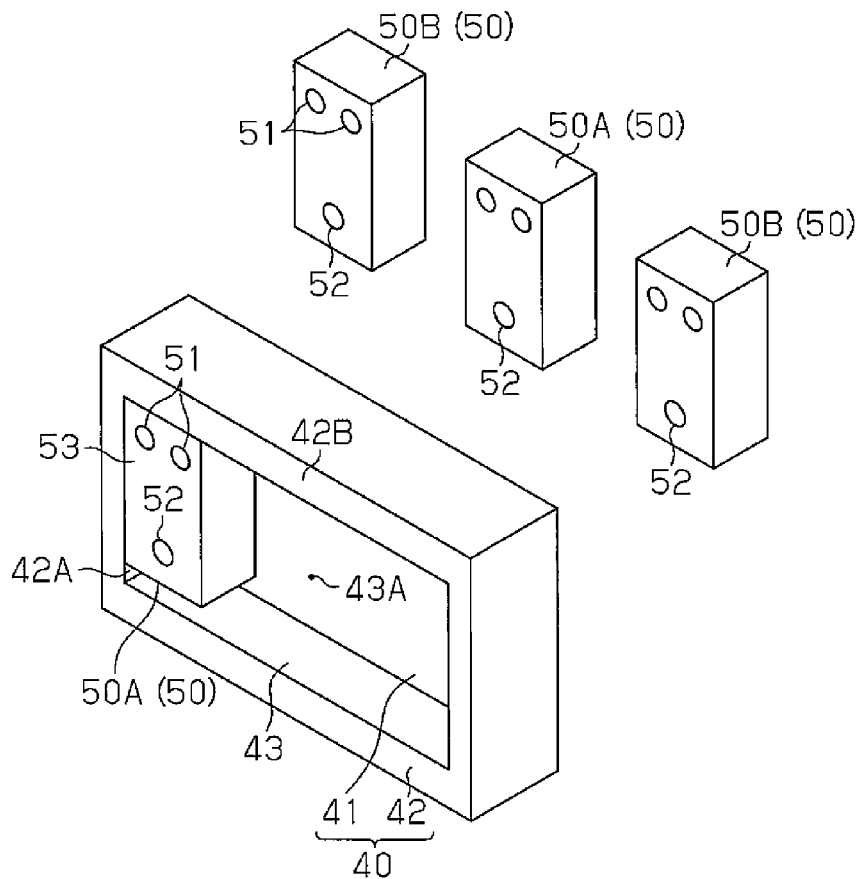
FIGS. 4A and 4B are diagrams illustrating a method for manufacturing an optical module according to the first embodiment.
Figure 4B:
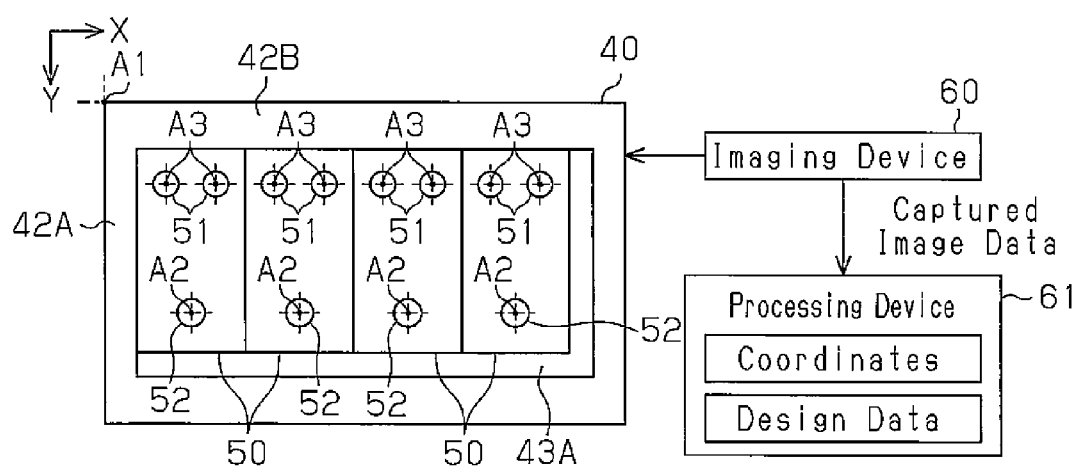

In the step shown in FIG. 4A (first step), a plurality of optical elements 50 are accommodated in and fixed to the recess 43 of the case 40. More specifically, the optical elements 50 are fixed to the bottom surface 43A with, for example, solder paste and/or adhesive resin in a manner that the electrode terminals 51 of the optical elements 50 and the surfaces of the optical elements 50 opposite to the surfaces 53 with the light emitting-receiving units 52 face the bottom surface 43A of the recess 43. In the present example, the leftmost optical element 50 fixed in the recess 43 is in close contact with the inner wall surface of one side wall 42A (on the left in the drawing) extending in the shorter side direction of the case 40. The leftmost optical element 50 is also in close contact with the inner wall surface of another side wall 42B (on the upper side in the drawing) extending in the longer side direction of the case 40. The other optical elements 50 are fixed in a manner that adjacent optical elements are in close contact with each other as shown in FIG. 4B, and are also in close contact with the inner wall surface of the side wall 42B. The assembly of the case 40 and the optical elements 50 may be referred to as an optical element assembly.

In the step shown in FIG. 4B (second step), the positions of the predetermined corner A1 and the optical axis center A2 of each optical element 50 accommodated in the case 40 are detected by, for example, performing imaging to identify (calculate) the coordinates indicating the position of each optical axis center A2 in one plane (xy plane) including the corner A1 as the reference point. For example, an imaging device 60, such as a charge-coupled device (CCD) camera, images the case 40 as well as each optical element 50 accommodated in the case 40, and provides the resulting imaging data to an image processing device 61. Although not shown, the image processing device 61 includes, for example, a central processing unit, a read-only memory (ROM) storing data and control programs, and a random-access memory (RAM) storing data. The image processing device 61 detects the position of the corner A1 of the case 40 and the position of the optical axis center A2 of each optical element 50 based on the imaging data, and generates a calculation result including the coordinates (XY coordinates) indicating the planar position of each optical axis center A2, with the corner A1 being set as the reference point (e.g., point of origin). In addition to the position of each optical axis center A2, the image processing device 61 may also detect the central point A3 of the electrode terminals 51 of each optical element 50 based on the imaging data. In this case, the image processing device 61 generates a calculation result including the coordinates indicating the planar position of each central point A3, with the corner A1 being set as the reference point.

Subsequently, the image processing device 61 generates design data, which includes a pattern of the optical waveguide 20 (cores 22) designed based on the calculation result. More specifically, the image processing device 61 sets the above corner A1 as the reference point, and generates design data including the relative positions of the reference point and the cores 22 (more specifically, the planar positions of the cores 22 to be formed) and the planar shape of the cores 22. When the above calculation result includes data indicating the position of the central point A3 of each electrode terminal 51, the image processing device 61 generates design data indicating the wiring pattern 12 (or the planar positions and the planar shape) in addition to the pattern of the cores 22.

In the steps shown in FIG. 5A to FIG. 7A, the wiring substrate 10 on which the optical waveguide 20 is to be formed integrally is prepared. First, in the step shown in FIGS. 5A and 5B, the predetermined wiring patterns 12 and 13 are formed on the two surfaces of the substrate body 11. The wiring pattern 13 defines the external connecting pads 13P at desirable positions. Also, as shown in FIG. 5B, the wiring pattern 12 defines the connecting pads P1 and P2 at desirable positions.

For example, the alignment mark M1 and the alignment marks M2 are formed on the upper surface of the substrate body 11 before the wiring patterns 12 and 13 are formed. The alignment marks M1 and M2 are used for alignment performed in a subsequent step when the case 40 and the optical elements 50 are mounted onto the wiring substrate 10. More specifically, the alignment mark M1 is aligned with the corner A1 of the case 40 when the case 40 is mounted onto the wiring substrate 10. The alignment marks M2 are aligned with the corners of the case 40 other than the corner A1 when the case 40 is mounted onto the wiring substrate 10. The other alignment marks M2 are formed at positions corresponding to the other corners of the case 40. These alignment marks M1 and M2 may be formed in a predetermined pattern by, for example, electroless plating or electrolysis plating. Subsequently, the intersecting point of the alignment mark M1 (that is, point corresponding to the corner A1) is set as the reference point (e.g., point of origin), and the wiring pattern 12 is formed based on the above design data in a manner that each connecting pad P2 is defined at the position of the central point A3 of the electrode terminal 51 of the corresponding optical element 50. More specifically, the wiring pattern 12 is formed based on the planar positions of the central points A3 in a manner that the central points A3 and the connecting pads P2 overlap as viewed from above, and the alignment marks M2 are set as the reference points. More specifically, the wiring pattern 12 is formed based on the planar positions of the central points A3 in a manner that the central points A1 and the central points of the connecting pads P2 are aligned with each other, with the alignment marks M2 are set as the reference points.

In the step shown in FIGS. 6A and 6B, the solder resist layer 14 having openings 14X that allow parts of the wiring pattern 12 to be exposed and function as the connecting pads P1 is formed on part of the upper surface of the substrate body 11. The solder resist layer 14 is first formed on the upper surface of the substrate body 11 to cover the wiring pattern 12, and then exposed and developed by photolithography to form the openings 14X and 14Y. As shown in FIG. 6B, the opening 14Y allows the substrate body 11 and the wiring pattern 12, which are at positions where the optical waveguide 20 is to be formed, to be exposed from the solder resist layer 14.

As shown in FIG. 6A, the solder resist layer 15 having openings 15X that allow parts of the wiring pattern 13 to be exposed and function as the external connecting pads 13P is formed on the lower surface of the substrate body 11. The solder resist layer 15 is first formed on the lower surface of the substrate body 11 to cover the wiring pattern 13, and then exposed and developed by photolithography to form the openings 15X.

When necessary, a metal layer consisting of a laminate of a Ni layer and an Au layer stacked in this order may be formed on the connecting pads P1 and the external connecting pads 13P. The metal layer may be formed by, for example, electroless plating.

Figure 7A:
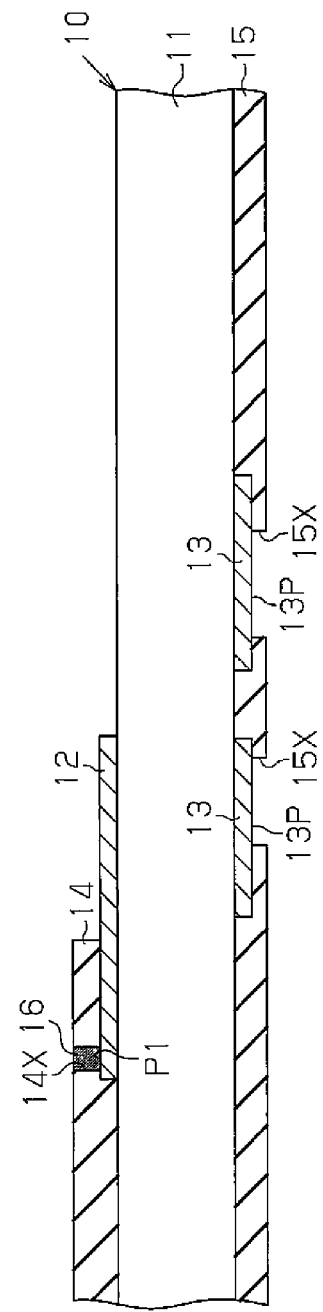
FIGS. 7A to 7C are schematic cross-sectional views illustrating the method for manufacturing the optical module of the first embodiment taken along line C-C in FIG. 6B.

In the step shown in FIG. 7A, solder portions 16 are formed on the connecting pads P1, which are exposed through the openings 14X of the solder resist layer 14. The solder portions 16 may be formed by, for example, applying a solder paste onto the connecting pads P1. This completes the wiring substrate 10.

Through the steps shown in FIG. 7B to FIG. 10B, the optical waveguide 20 is stacked (integrated) on the mounting surface of the wiring substrate 10. In the step shown in FIG. 7B, the first clad layer 21 is first formed to cover the wiring pattern 12 on the upper surface of the substrate body 11 where no solder resist layer 14 has been formed. For example, a photosensitive resin layer (not shown) for forming the first clad layer 21 may be formed on the entire upper surface of the substrate body 11. The photosensitive resin layer is then exposed and developed by photolithography, and cured to form the first clad layer 21. The photosensitive resin layer may be formed by, for example, applying a liquid photosensitive resin onto the entire upper surface of the substrate body 11, or by laminating a semi-cured photosensitive resin sheet onto the entire upper surface of the substrate body 11. The photosensitive resin may be, for example, resin that is curable when subjected to ultraviolet (UV) rays. Such UV curable resin may be a resin material containing modified acrylate (epoxy resin or polyester resin) as a base resin and additionally containing a reactive acrylic monomer necessary for photopolymerization, a photopolymerization starting agent, and an additive agent. The main reaction of such UV curable resin is radical polymerization. Such UV curable resin allows for treatment at ordinary temperature. The UV curable resin is cured in a shorter time than a heat curable resin. The use of the UV curable resin thus shortens the treatment time. The same applies to the photosensitive resin or the like used in the steps for forming the core layer 22A and the second clad layer 23 described later.

Figure 7B:
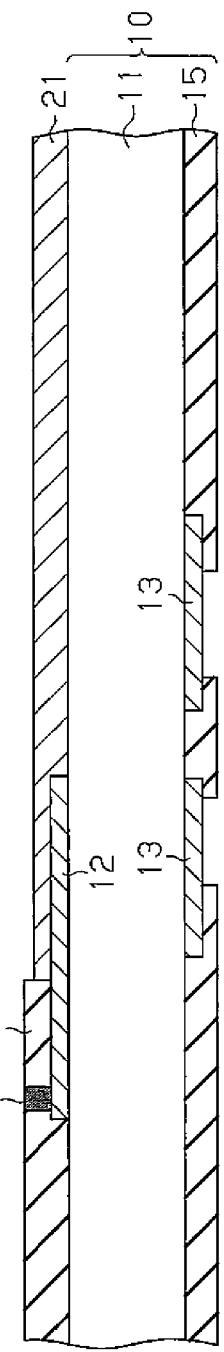
Figure 7C:
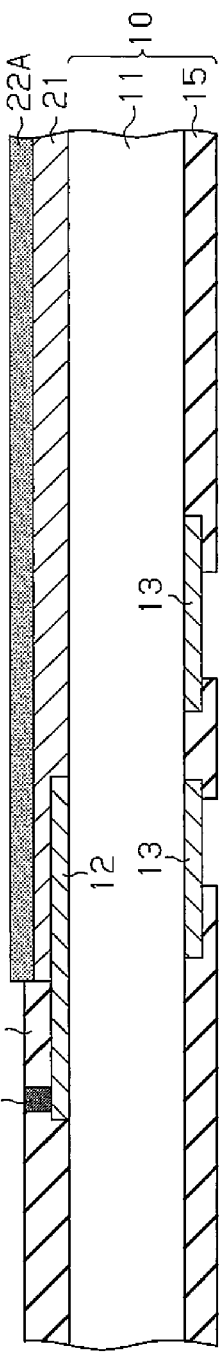

In the step shown in FIG. 7C, the core layer 22A for forming the cores 22 is formed on the upper surface of the first clad layer 21. The core layer 22A may be formed by, for example, applying a liquid photosensitive resin onto the upper surface of the first clad layer 21, or laminating a semi-cured photosensitive resin sheet onto the upper surface of the first clad layer 21.

Subsequently, in the step shown in FIGS. 8A to 8C (third step), the core layer 22A is patterned based on the above design data to form the cores 22 with a predetermined shape. In the present embodiment, as shown in FIG. 8B, a plurality of (four corresponding one-to-one to the channels) strip-shaped cores 22, which extend linearly in the X-direction, are arranged in the Y-direction. For example, the core layer 22A is selectively irradiated at the predetermined positions (positions corresponding to where the cores 22 are to be formed) with active energy beams or electron beams based on the design data to pattern the cores 22 with a predetermined shape. In detail, the cores 22 are patterned based on the design data in a manner that each core 22 overlaps with the axis center A2 of the corresponding optical element 50 as viewed from above. More specifically, the cores 22 are formed in a manner that each optical axis center A2 and the corresponding core 22 are at the same planar positions based on, for example, the coordinates indicating each optical axis center A2 detected by, for example, a CCD camera, with the intersecting point of the alignment mark M1 being set as the reference point. More specifically, the cores 22 are patterned based on the coordinates indicating each optical axis center A2 in a manner that the Y-coordinate of each optical axis center A2 conforms to the Y-coordinate of the center of the corresponding core 22 in the width direction. The alignment mark M1 is covered by the first clad layer 21 and the core layer 22A that are formed from a transparent resin material. Thus, the position of the alignment mark M may be detected by using, for example, a CCD camera.

The core layer 22A may be irradiated with active energy beams or with electron beams by, for example, using a direct imaging (maskless) exposure apparatus. More specifically, the cores 22 are formed by, for example, directly irradiating the core layer 22A with active energy beams or electron beams having high directivity, such as laser light, without using a mask. Examples of the active energy source include visible light, ultraviolet light, infrared light, or laser light. When the core layer 22A is irradiated with electron beams, the amount of electron beams may be, for example, about 50 KGy to about 200 KGy.

The refractive index changes in the parts of the core layer 22A irradiated with active energy beams or electron beams. This generates a difference in refractive index between the parts irradiated with active energy beams or electron beams and the parts of the core layer 22A that have not been irradiated with active energy beams or electron beams. The parts irradiated with active energy beams or electron beams may have a larger refractive index or a smaller refractive index, depending on the material used for the core layer 22A. In the present embodiment, the parts of the core layer 22A irradiated with active energy beams or electron beams will have a larger refractive index. As a result, the parts of the core layer 22A irradiated with active energy beams or electron beams will function as the cores 22, and the parts of the core layer 22A that have not been irradiated with active energy beams or electron beams will function as the clad portions 22B. Thus, as shown in FIG. 8C, each clad portion 22B is formed between adjacent cores 22. The refractive index of the clad portions 22B is substantially the same as the refractive index of the first clad layer 21 and a clad layer 23A, which is formed in a subsequent step.

As described above, the cores 22 are patterned by irradiating the core layer 22A with, for example, active energy beams. Thus, the pattern of irradiation (positions of irradiation) with active energy beams for the core layer 22A is set based on the design data, with the intersecting point of the alignment mark M1 being set as the reference point. This enables the cores 22 with a desirable planar shape to be formed at the desirable planar positions. Further, this enables the cores 22 to be formed at positions corresponding to the actual positions of the optical axis centers A2 of the optical elements 50 that are fixed to the case 40 in the previous step. If pitches B1, B2, and B3 of the optical axis centers A2 of the optical elements 50 (refer to FIG. 8B) differ from one another, pitches C1, C2, and C3 of the cores 22 (refer to FIG. 8C) may be set in correspondence with the pitches B1, B2, and B3.

In the present step, the cores 22 are formed by using a direct imaging exposure apparatus. The use of the direct imaging exposure apparatus (exposure technique) eliminates positional deviations that may occur when a mask is used. This structure thus enables the cores 22 with the desirable planar shape to be formed at desirable planar positions.

Figure 9A:
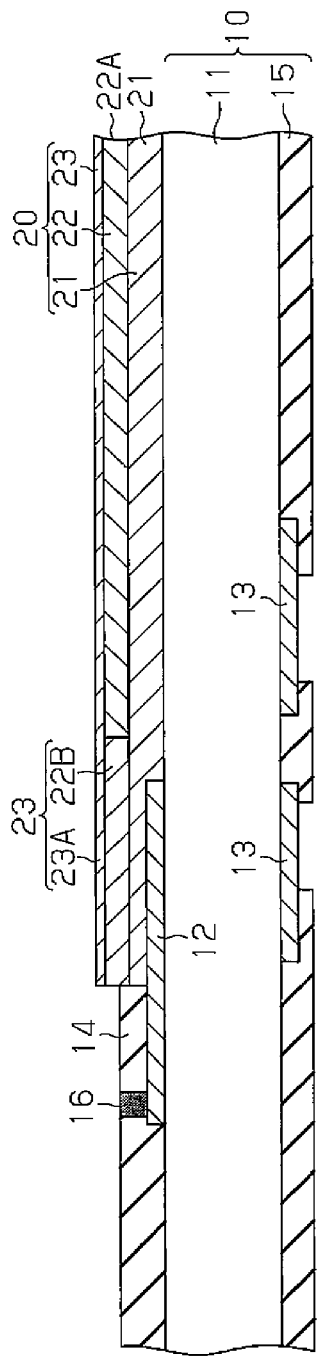
FIGS. 9A to 9C are cross-sectional views of the optical module of the first embodiment illustrating the method for manufacturing the optical module taken along line E-E in FIG. 8B.

In the step shown in FIG. 9A, the clad layer 23A is formed on the upper surface of the core layer 22A to cover the cores 22 and the clad portions 22B. For example, a photosensitive resin layer (not shown) for forming the clad layer 23A may be formed on the upper surface of the core layer 22A. The photosensitive resin layer is then exposed and developed with photolithography, and is cured to form the clad layer 23A. This forms the second clad layer 23 including the clad portions 22B and the clad layer 23A. The steps described above form the optical waveguide 20 including the cores 22 surrounded by the first clad layer 21 and the second clad layer 23 on the wiring substrate 10.

Figure 9B:
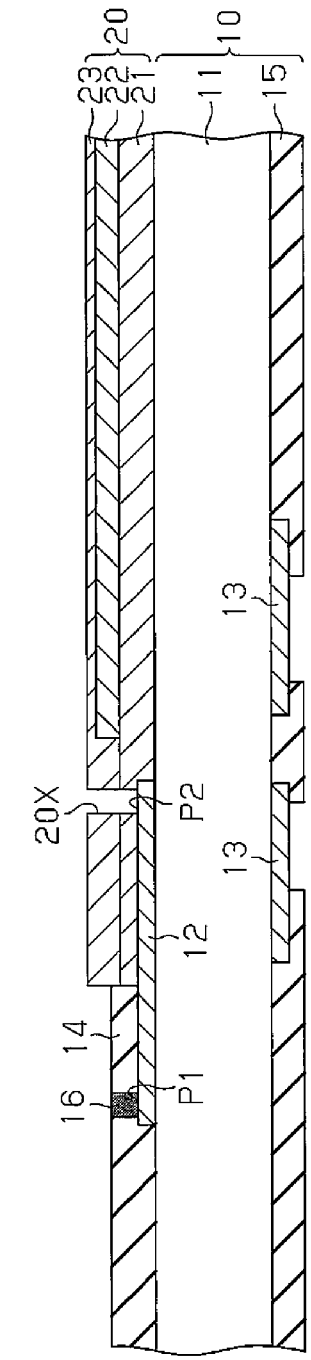

Subsequently, in the step shown in FIG. 9B, the openings 20X are formed at predetermined positions on the optical waveguide 20a to allow parts of the wiring pattern 12 to be exposed and function as the connecting pads P2. The openings 20X may be formed by laser processing performed using, for example, a $CO_2$ laser or a UV-YAG laser. When the first clad layer 21 and the second clad layer 23 are formed from a photosensitive resin, the predetermined openings 20X may be formed by, for example, photolithography.

Figure 9C:
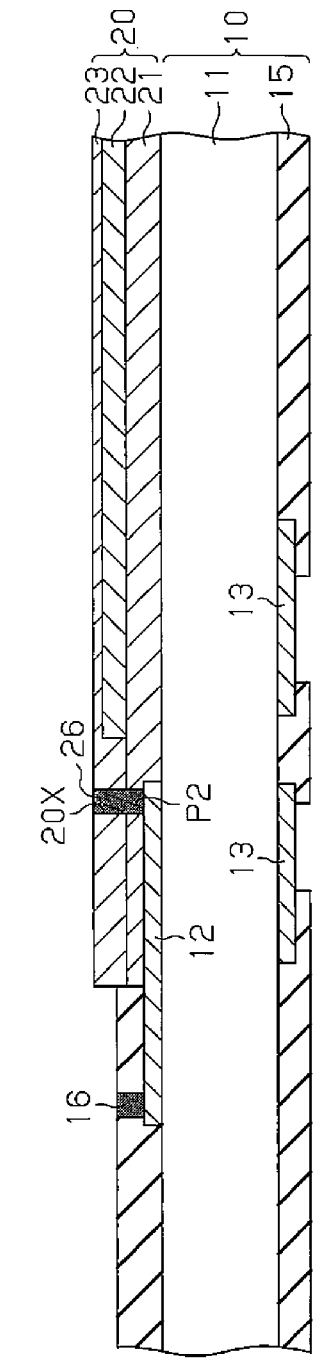

In the step shown in FIG. 9C, the solder portions 26 are formed on the connecting pads P2 exposed through the openings 20X of the optical waveguide 20. The solder portions 26 are formed by, for example, applying a solder paste onto the connecting pads P2.

In the step shown in FIGS. 10A and 10B (fourth step), the groove 24, which has a substantially regular triangular cross-section, and the reflective mirror 25 are formed at predetermined positions on the optical waveguide 20 based on the design data. For example, the reflective mirror 25 is formed at the position overlapping with the position of the optical axis center A2 of each optical element 50 as viewed from above, and the intersecting point of the alignment mark M1 detected with, for example, a CCD camera is set as the reference point.

In detail, part of the optical waveguide 20 where the reflective mirror 25 is to be formed is cut in the thickness direction by using, for example, a rotating blade of a cutter. This forms the groove 24 in the optical waveguide 20. The groove 24 has the inclined surface 24A, which deflects or changes an optical path of incident light by 90 degrees, and the side wall surface 24B, which intersects with the inclined surface 24A. The groove 24 may be formed by a method other than cutting. For example, the groove 24 may be formed by various methods, such as laser abrasion.

Subsequently, a mask (not shown) having an opening corresponding to the groove 24 is used, and a glossy metal film is formed selectively on the inclined surface 24A of the groove 24. This forms the reflective mirror 25 on the inclined surface 24A. The inclined surface 24A may be coated with the metal film formed by performing, for example, sputtering, vapor deposition, or plating. The metal film may be made of, for example, gold, silver, or aluminum, which has high reflectivity of light.

In the step shown in FIG. 11A, the electrode terminals 31 of the electronic component 30 are aligned on the connecting pads P1 of the wiring substrate 10. The solder portions 16 are melted to electrically connect the electrode terminals 31 of the electronic component 30 with the connecting pads P1. This completes the flip-chip mounting of the electronic component 30 onto the wiring substrate 10.

In the step shown in FIG. 11A, the corner A1 of the case 40 is aligned with the alignment mark M1 (refer to FIG. 10B) and the other corners of the case 40 are aligned with the alignment marks M2 (refer to FIG. 10B), while the light emitting-receiving units 52 of the optical elements 50 accommodated in the case 40 are facing downward. This aligns the electrode terminals 51 of the optical elements 50 on the connecting pads P2 of the wiring substrate 10. In this state, the solder portions 26 are melted to electrically connect the electrode terminals 51 of the optical elements 50 to the connecting pads P2. This completes the mounting of the optical elements 50 and the case 40 onto the wiring substrate 10 on which the optical waveguide 20 is stacked. As described above, the case 40 is aligned and mounted by using the alignment mark M1 as the reference point, which has been used to form the cores 22 and the reflective mirror 25. This enables the optical elements 50 fixed to the case 40 to be arranged accurately at designed positions. In the assembled structure, the light emitting-receiving unit 52 of each optical element 50 is immediately above the reflective mirror 25, and the Y-coordinate of the optical axis center A2 of each optical element 50 substantially conforms to the Y-coordinate the center of the corresponding core 22 in the width direction. This allows the optical elements 50 to be optically coupled to the optical waveguide 20 (cores 22) with the reflective mirror 25, while reducing misalignment between the optical axes of the optical elements 50 and the cores 22 or the reflective mirror 25. Thus, optical coupling loss may be suppressed.

The alignment marks M1 and M2 are covered with the first clad layer 21 and the second clad layer 23, which are formed from a transparent resin material. Thus, the positions of these alignment marks M1 and M2 may be detected by using, for example, a CCD camera.

In the step shown in FIG. 11B, the underfill resin 17 is filled between the wiring substrate 10 and the electronic component 30. The underfill resin 27 is filled in the gaps between the wiring substrate 10 on which the optical waveguide 20 has been stacked, the case 40, and the optical elements 50. The underfill resin 27 also fills the groove 24.

The manufacturing steps described above yield the optical module 1 shown in FIGS. 1A and 1B.

The above embodiment has the advantages described below.

(1) The cores 22 and the reflective mirror 25 are formed at the planar positions corresponding to the optical axis centers A2 of the optical elements 50, with the corner A1 of the case 40 being set as the reference point. More specifically, the cores 22 and the reflective mirror 25 are formed at the planar positions corresponding to the planar positions of the optical axis centers A2 of the optical elements 50, and the alignment mark M1 that is aligned with the corner A1 of the case 40 is set as the reference point. The corner A1 of the case 40 is aligned with the alignment mark M1 when the case 40 and the plurality of optical elements 50 fixed to the case 40 are mounted at desirable positions on the wiring substrate 10. Thus, accurate alignment of the corner A1 of the case 40 with the alignment mark M1 enables accurate alignment of the optical axis centers A2 of all the optical elements 50 fixed to the case 40, the position of the reflective mirror 25, and the positions of the cores 22 arranged in correspondence with the optical elements 50. More specifically, a single alignment performed accurately in the step of mounting the case 40 onto the wiring substrate 10 enables the large number of optical elements 50 to be aligned accurately with the reflective mirror 25 and the cores 22 of the case 40. This enables the optical elements 50 to be optically coupled with the optical waveguide 20 (cores 22) by the reflective mirror 25, while reducing misalignment between the optical axes of the optical element 50 and the cores 22 or the reflective mirror 25. This reduces optical coupling loss.

The optical module 1 of the present embodiment including increased channels for carrying optical signals (cores 22) also enables easy alignment between the optical elements 50, the cores 22, and the reflective mirror 25. This enables the optical module 1 having the multiple-channel optical waveguide 20 (cores 22) to be manufactured easily.

(2) The light emitting elements 50A and the light receiving elements 50B are fixed to the case 40, and thus the light emitting elements 50A, the light receiving elements 50B, and the case 40 are mounted in a single package onto the wiring substrate 10. This eliminates the need to design a structure that avoids interference between jigs used for different elements, which may occur when the light emitting elements 50A and the light receiving elements 50B are mounted onto the wiring substrate 10. Further, this enables the light emitting elements 50A and the light receiving elements 50B to be in close contact with each other and fixed in the case 40, and reduces the distance occupied by all the cores 22.

A light emitting element (for example, VCSEL) and a light receiving element (for example, PD) are manufactured through different steps. Mounting the light emitting element and the light receiving element on a single optical element would thus be difficult. In the present embodiment, the light emitting element 50A and the light receiving element 50B that have been manufactured separately are fixed in the case 40. This enables the case containing both the light emitting element 50A and the light receiving element 50B to be mounted on the wiring substrate 10.

Further, the light emitting element 50A and the light receiving element 50B adjacent to each other are fixed in close contact with each other. This enables different optical elements 50 to be arranged at uniform intervals.

(3) The light emitting elements 50A and the light receiving elements 50B are arranged alternately and fixed in the recess 43 of the case 40. In this structure, the core 22 optically coupled to the light emitting element 50A is arranged adjacent to the core 22 optically coupled to the light receiving element 50B. More specifically, the core 22 optically coupled to the light receiving element 50B is arranged between the two cores 22 each optically coupled to the light emitting element 50A. This structure allows the cores 22 optically coupled to the light emitting elements 50A to have a large pitch (e.g., C1+C2) (e.g., about 250 µm) when the pitches C1, C2, and C3 of the cores 22 (refer to FIG. 8C) are set to be small (e.g., about 125 µm). Further, this structure thus prevents crosstalk from increasing between the channels of the light emitting elements 50A and between the channels of the light receiving elements 50B when the pitches C1, C2, and C3 of the cores 22 are set to be small. Additionally, this allows the cores 22 to have smaller pitches, and miniaturizes the optical module 1.

(4) The manufacturing yield of multiple-channel (n-channel) optical elements 50 may be low, and the cost of an n-channel optical element 50 may thus be higher than the total cost of an n number of single-channel optical elements. In the present embodiment, the plurality of single-channel optical elements 50 are accommodated in the case 40 to form the optical module 1 with the multiple-channel optical waveguide 20 (cores 22). This enables the optical module 1 with the multiple-channel cores 22 to be manufactured at a lower cost.

An optical module according to a second embodiment will now be described with reference to FIG. 12A to FIG. 20B. The components that are the same as the components shown in FIG. 1A to FIG. 11B are given the same reference numerals as those components and will not be described in detail.

Figures 12A, 12B:
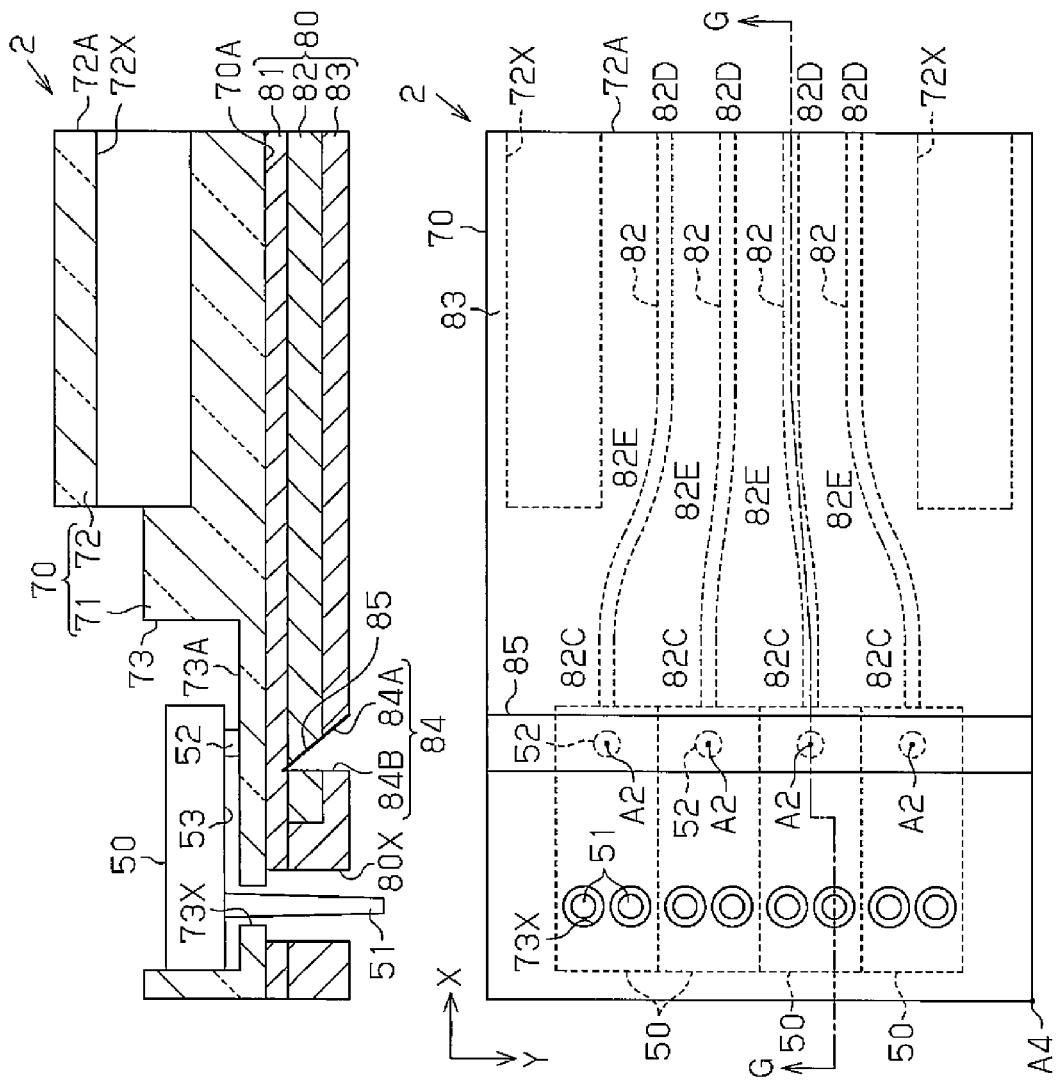
FIG. 12A is a schematic cross-sectional view of an optical connector according to a second embodiment taken along line G-G in FIG. 12B.
FIG. 12B is a schematic plan view of the optical connector of FIG. 12A viewed from below.

As shown in FIGS. 12A and 12B, the optical module of the second embodiment may be an optical connector 2 including a case 70, an optical waveguide 80, and a plurality of optical elements 50 accommodated in the case 70.

Figure 13A:
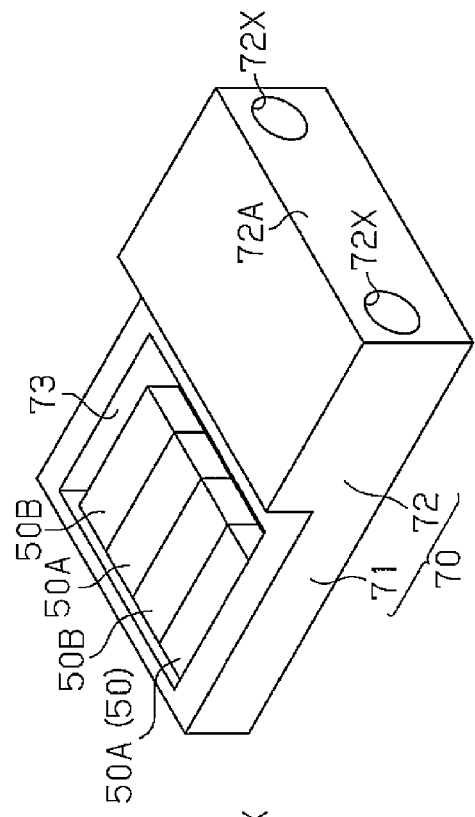
FIGS. 13A and 13B are schematic perspective views of a case according to the second embodiment.

As shown in FIG. 13A, the case 70 is substantially rectangular. The case 70 includes a case portion 71, and a connector portion 72 that is thicker than the case portion 71. The case 70 (case portion 71 and connector portion 72) may be formed from a material that is transparent to wavelengths of light used by the optical elements 50. For example, the case 70 may be formed from a glass material.

Figure 13B:
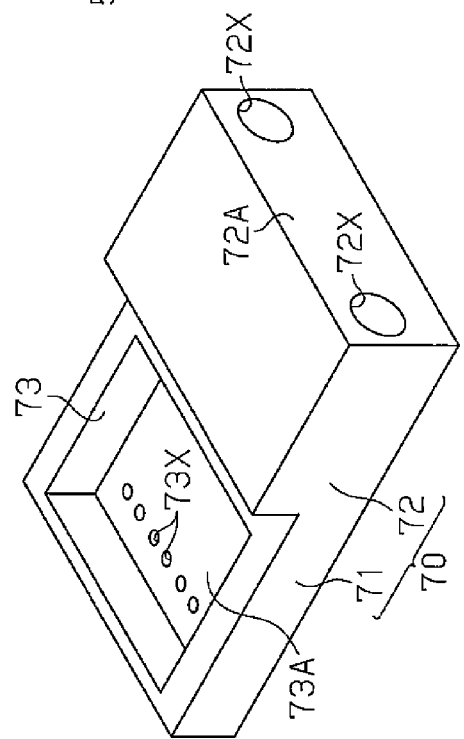

The case portion 71 includes a recess (accommodation portion) 73, which is substantially rectangular as viewed from above. The recess 73 has a bottom surface 73A having a plurality of linearly arranged through-holes 73X. The drawing only shows six of the eight through-holes 73X. As shown in FIG. 13B, the recess 73 contains a plurality of (e.g., four) optical elements 50. In the present embodiment, the recess 73 houses two single-channel light emitting elements 50A and two single-channel light receiving elements 50B. More specifically, the light emitting elements 50A and the light receiving elements 50B are arranged alternately in the case 70. Each optical element 50 is fixed in close contact with the adjacent optical element 50 in the recess 73. For example, the optical elements 50 are fixed to the bottom surface 73A of the recess 73 with insulating adhesive resin or with underfill resin. The optical elements 50 may be fixed in the recess 73 with insulating adhesive resin or underfill resin filled between the optical element 50 and the case 70 in the recess 73.

As shown in FIG. 12A, the optical elements 50 are fixed in the recess 73, and the surfaces 53 including the electrode terminals 51 and the light emitting-receiving units 52 face the bottom surface 73A of the recess 73. The electrode terminals 51 of each optical element 50 extends through the through-holes 73X of the recess 73.

The optical elements 50 accommodated in the recess 73 may be multiple-channel optical elements that include multiple-channel light emitting units or light receiving units. The optical elements 50 accommodated in the recess 73 may all be light emitting elements or may all be light receiving elements.

As shown in FIGS. 13A and 13B, guide holes 72X are formed on two ends of a side surface 72A of the connector portion 72. Each guide hole 72X extends through the connector portion 72 in the planar direction. The two guide holes 72X are engaged with, for example, guide pins (not shown), which are used for alignment when this connector is connected to another connector (e.g., standardized MT connector). When, for example, the optical connector 2 is connected to an MT connector, the dimensions of the guide holes (e.g., the opening diameter and the pitch of the guide holes 72X) are determined to satisfy the standard specifications of the MT connector. Although the guide holes 72X are formed in the connector portion 72 in the present embodiment, the guide pins may be formed on the connector portion 72 instead.

As shown in FIG. 12A, the optical waveguide 80 is formed on the lower surface 70A of the case 70 (case portion 71 and connector portion 72). The optical waveguide 80 includes a first clad layer 81, cores 82, and a second clad layer 83.

The first clad layer 81 is formed on the lower surface 70A of the case 70. The cores 82, which carry optical signals, are formed below the first clad layer 81. The second clad layer 83 is formed below the first clad layer 81 to cover the cores 82. As described above, the optical waveguide 80 includes the first clad layer 81, the cores 82, and the second clad layer 83 stacked in this order on the lower surface 70A of the case 70. The cores 82 are surrounded by the first clad layer 81 and the second clad layer 83.

The first and second clad layers 81 and 83 and the cores 82 may be formed from basically the same material. For example, the first and second clad layers 81 and 83 and the cores 82 may be formed from a resin material that is transparent to wavelengths of light used by the optical elements 50. More specifically, the first and second clad layers 81 and 83 and the cores 82 are formed from acrylic resin, such as polymethyl methacrylate (PMMA), epoxy resin, or silicone resin. To allow optical signals to be transmitted only within the cores 82, the cores 82 are formed from a material having a higher refractive index than the material used for the first and second clad layers 81 and 83 formed on the upper and lower surfaces of the cores 82.

As shown in FIG. 12B, a plurality of (e.g., four) cores 82, the number of which corresponds to the number of the optical elements 50 (more specifically, channels) accommodated in the case 70, are arranged in the Y-direction. Each core 82 includes a first portion 82C, which is at a large distance from the adjacent core 82, a second portion 82D, which is at a small distance from the adjacent core 82, and a third portion 82E, which is curved to connect the first portion 82C and the second portion 82D. More specifically, the pitch for the part (first portion 82C) of each core 82 near the light emitting-receiving unit 52 of the corresponding optical element 50 is set to be larger than the pitch for the part (second portion 82D) of each core 82 near the side surface 72A of the case 70. When, for example, the optical connector 2 is connected to the above MT connector, the pitch of the cores 82 connected to the MT connector (specifically, the pitch of the second portions 82D of the cores 82) is set based on the standard specifications of the MT connector. As shown in FIG. 12B, when the pitch of the second portions 82D of the cores 82 differs from the pitch of the first portions 82C of the cores 82 (more specifically, the pitch of the optical axis centers A2 of the optical elements 50), the cores 82 are patterned in accordance with the differing pitches. When the guide pins of the MT connector are engaged with the guide holes 72X of the optical connector 2 to couple the connectors together, the axis of the second portions 82D of the cores 82 is accurately aligned with, for example, the axis of the tape fibers forming the MT connector.

These cores 82 are formed at planar positions corresponding to the positions of the light emitting-receiving units 52 of the optical elements 50 accommodated in the case 70. More specifically, the cores 82 are formed at the planar positions corresponding to the coordinates (planar positions) of the optical axis centers A2 of the optical elements 50, and a certain point of the case 70 (e.g., corner A4 of the case 70) is set as a reference point (e.g., point of origin). More specifically, the cores 82 are formed in a manner that the Y-coordinate of each optical axis center A2 conforms to the Y-coordinate of the center of the first portion 82C of each core 82 in the width direction, and the corner A4 is set as the reference point.

The thickness of the first clad layer 81 shown in FIG. 12A may be, for example, about 10 μm to about 100 μm. The thickness of the core 82 may be, for example, about 30 μm to about 80 μm. The pattern width of each core 82 may be, for example, about 300 μm to about 500 μm. The pitch of the first portions 82C of the cores 82 may be, for example, about 100 μm to about 500 μm. The pitch of the second portions 82D of the cores 82 may be, for example, about 125 μm to about 300 μm. The thickness of the second clad layer 83 formed on the cores 82 may be, for example, about 10 μm to about 100 μm.

The optical waveguide 80 includes a groove 84, which allows the cores 82 to be exposed. The groove 84 extends from the lower surface of the second clad layer 83 through the cores 82 and extends to a middle position in the thickness direction of the first clad layer 81. The second clad layer 83 and the cores 82 are separated by the groove 84. The groove 84 includes an inclined surface 84A, which deflects or changes an optical path of incident light by 90 degrees, and a side wall surface 84B, which intersects with the inclined surface 84A. For example, the side wall surface 84B of the groove 84 may be a vertical surface perpendicular to the direction in which the optical waveguide 80 (cores 82) extends. The inclined surface 84A is inclined by a predetermined angle (e.g., 45 degrees) with respect to the direction in which the optical waveguide 80 (cores 82) extends. The groove 84 has a substantially regular triangular cross-section.

A reflective mirror 85, which deflects or changes an optical path of incident light by 90 degrees, is formed on the inclined surface 84A. The reflective mirror 85 is formed from, for example, gold, silver, or aluminum, which has high reflectivity of light.

As shown in FIG. 12B, the reflective mirror 85 extends in the Y-direction and forms a strip-shaped groove perpendicular to the cores 82. The reflective mirror 85 faces the light emitting-receiving unit 52 of each optical element 50, which is mounted on the optical waveguide 80. For example, the reflective mirror 85 is formed on a planar position determined by the coordinates of the optical axis center A2 of each optical element 50, and the corner A4 of the case 70 is set as the reference point.

As shown in FIG. 12A, the optical waveguide 80 includes openings 80X that extend through the optical waveguide 80 in the thickness direction and communicate with the through-holes 73X of the case 70. The electrode terminals 51 of each optical element 50 accommodated in the case 70 are placed in the openings 80X. The openings 80X are circular as viewed from above. The diameter of the openings 80X is smaller than the diameter of the through-holes 73X.

The structure of the optical module 1A will now be described.

Figure 14:
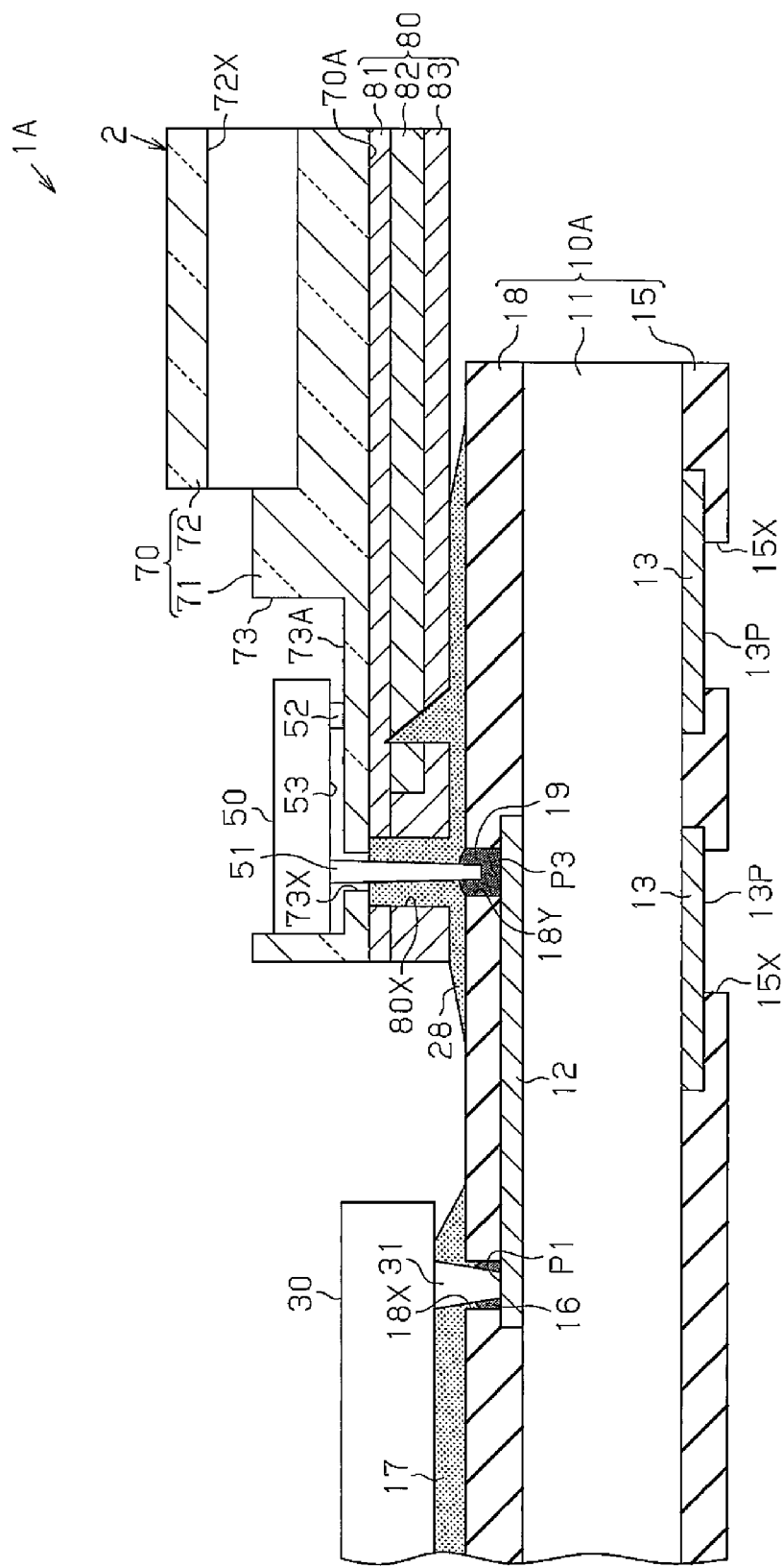
FIG. 14 is a schematic cross-sectional view of an optical module according to the second embodiment.

As shown in FIG. 14, the optical module 1A includes a wiring substrate 10A, an optical connector 2 on which a plurality of optical elements 50 are mounted and an optical waveguide 80 is formed integrally, and an electronic component 30.

The wiring substrate 10A includes a substrate body 11, a wiring pattern 12 serving as an uppermost layer, a wiring pattern 13 serving as a lowermost layer, and solder resist layers 15 and 18.

The solder resist layer 18 is formed on the upper surface of the substrate body 11 to cover the wiring pattern 12. The solder resist layer 18 includes openings 18X, which allow parts of the wiring pattern 12 to be exposed and function as connecting pads P1, and includes openings 18Y, which allow parts of the wiring pattern 12 to be exposed and function as connecting pads P3. Solder portions 16 are formed on the connecting pads P1 to electrically connect the connecting pads P1 and the electrode terminals 31 of the electronic component 30. Solder portions 19 are formed on the connecting pads P3 to electrically connect the connecting pads P3 and the electrode terminals 51 of the optical elements 50. When necessary, the parts of the wiring pattern 12 exposed through the openings 18X and 18Y may be subjected to organic solderability preservative (OSP) to form an OSP film on these parts. The solder portions 16 and 19 may then be formed on the OSP film. Alternatively, a metal layer may be formed on the parts of the wiring pattern 12 exposed through the openings 18X and 18Y. The solder portions 16 and 19 may then be formed on the metal layer. Examples of the metal layer may include, for example, an Au layer, an Ni—Au layer, and an Ni—Pd—Au layer.

Each of the openings 18X and 18Y and each of the connecting pads P1 and P3 may be circular as viewed from above and may have a diameter of, for example, about 50 μm to about 200 μm. The thickness from the upper surface of the substrate body 11 to the upper surface of the solder resist layer 18 may be, for example, about 10 μm to about 100 μm. The solder resist layer 18 may be formed from, for example, epoxy or acrylic insulating resin.

The electronic component 30 is electrically connected to the connecting pads P1 of the wiring substrate 10A with the electrode terminals 31 and the solder portions 16. More specifically, the electronic component 30 is flip-chip-mounted onto the wiring substrate 10A.

The optical connector 2 is mounted on the wiring substrate 10A in a manner that the optical elements 50 fixed to the case 70 are electrically connected to the connecting pads P3 of the wiring substrate 10A with the electrode terminals 51 and the solder portions 19. The optical elements 50 are thus electrically connected to the electronic component 30 by the electrode terminals 51, the wiring pattern 12, and the electrode terminals 31.

An underfill resin 28 is filled between the optical connector 2 and the wiring substrate 10A. The underfill resin 28 increases the coupling strength between the electrode terminals 51 of the optical elements 50 and the connecting pads P3 of the wiring substrate 10A. The underfill resin 28 fills the gap between the upper surface of the wiring substrate 10A (solder resist layer 18) and the lower surface of the optical elements 50 (optical waveguide 80). The underfill resin 28 may be resin that is transparent to wavelengths of light used by the optical elements 50. More specifically, the underfill resin 28 may be formed from the same resin material as used for the first clad layer 81, the cores 82, and the second clad layer 83.

A method for manufacturing the optical connector 2 will now be described.

In the step shown in FIG. 15A, the case 70 including the case portion 71 and the connector portion 72 that are integrated together is prepared. The case portion 71 has the recess 73. The connector portion 72 has the pair of guide holes 72X. Subsequently, the plurality of optical elements 50 are accommodated in the recess 73 (first step). More specifically, the optical elements 50 are fixed to the bottom surface 73A by, for example, insulating adhesive resin or underfill resin, in a manner that the electrode pads 54 (cathode electrodes or anode electrodes) of the optical elements 50 and the surfaces 53 with the light emitting-receiving units 52 face the bottom surface 73A of the recess 73. The optical elements 50 are accommodated in the recess 73 in a manner that the electrode pads 54 of the optical elements 50 face the through-holes 73X of the recess 73. When necessary, a conductive resin or solder may be filled in the through-holes 73X.

In the step shown in FIG. 15B (second step), the positions of the predetermined corner A4 of the case 70 and the optical axis center A2 of each optical element 50 accommodated in the case 70 are detected by, for example, performing imaging to identify (calculate) the coordinates indicating the position of each optical axis center A2 in one plane (xy plane) including the corner A4 as the reference point. For example, an imaging device 60, such as a CCD camera, images the case 70 as well as each optical element 50 accommodated in the case 70 from the lower surface side of the case 70, and provides the resulting imaging data to an image processing device 61. The image processing device 61 detects the position of the corner A4 of the case 70 and the position of the optical axis center A2 of each optical element 50 based on the resulting imaging data, and generates a calculation result containing the coordinates indicating the planar position (XY-coordinates) of the optical axis center A2 of each optical element 50, with the position of the corner A4 being set as the reference point (e.g., point of origin). When the pitch or the planar position of the part of the core 82 near the side surface 72A of the connector portion 72 (second portion 82D) of the core 82 can be determined in accordance with the standard specifications of the MT connector, the image processing device 61 also generates a calculation result containing the coordinates indicating the planar position of the second portion 82D of the core 82, and the corner A4 is set as the reference point. The case 70 is formed from a glass material having transparency. Thus, imaging the case 70 from its lower surface side using the imaging device 60 enables the position of the optical axis center A2 of each optical element 50 to be detected.

Subsequently, the image processing device 61 generates design data containing a designed pattern of the optical waveguide 80 (cores 82) based on the above calculation result. More specifically, the image processing device 61 generates design data indicating the relative positions of the reference point and the cores 82 (planar positions of the cores 82 to be formed) and the planar shape of the cores 82, with the corner A4 being set as the reference point.

Through the steps shown in FIG. 16B to FIG. 18B, the optical waveguide 80 is stacked (integrated) on the lower surface 70A of the case 70. In the step shown in FIG. 16A, the first clad layer 81 is formed to cover the entire lower surface 70A of the case 70 through the same manufacturing step as shown in FIG. 7B. Subsequently, in the step shown in FIG. 16B, the core layer 82A for forming the cores 82 is formed on the lower surface of the first clad layer 81 to cover the entire lower surface of the first clad layer 81.

Figure 8A:
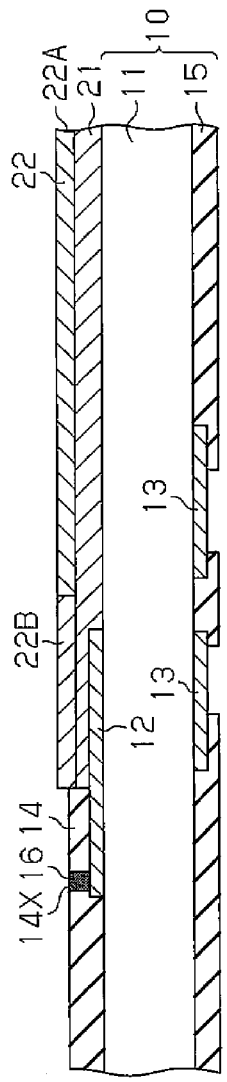
FIG. 8A is a schematic cross-sectional view illustrating the method for manufacturing the optical module of the first embodiment taken along line E-E in FIG. 8B.
Figure 8B:
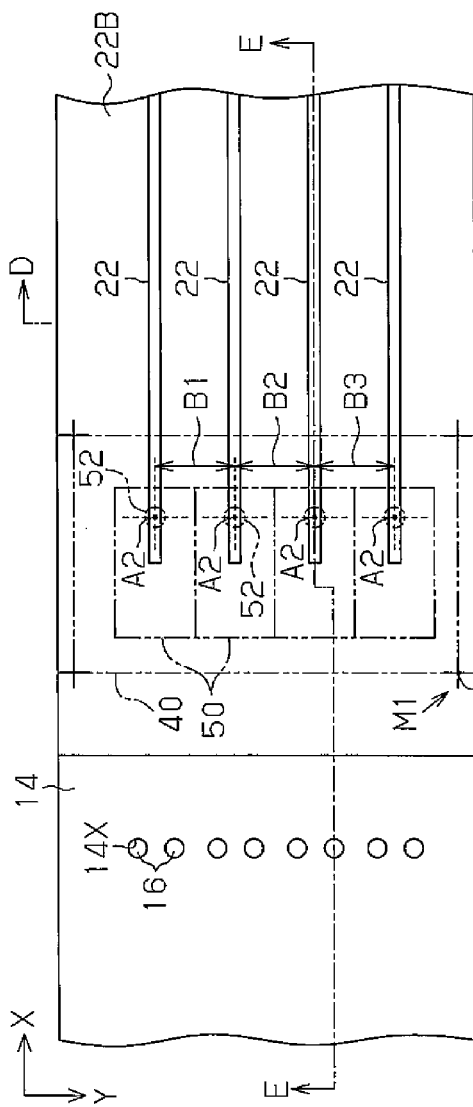
FIG. 8B is a schematic plan view of the optical module of FIG. 8A.
Figure 8C:
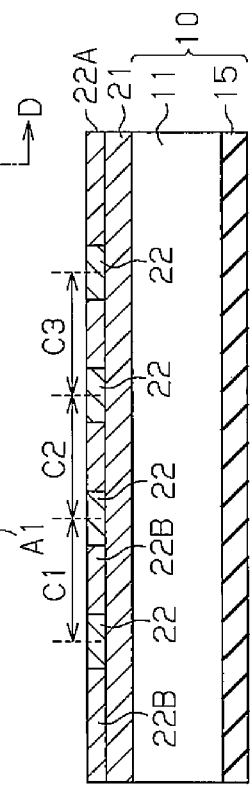
FIG. 8C is a schematic cross-sectional view of the optical module of FIG. 8B taken along line D-D.
Figure 17A:
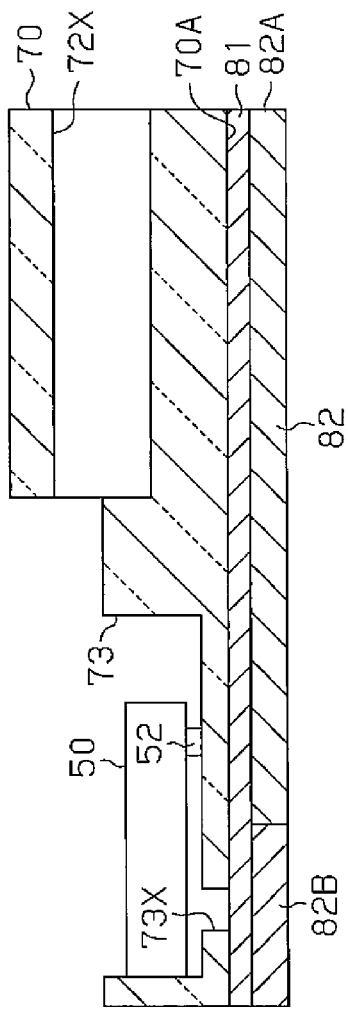
FIG. 17A is a schematic cross-sectional view illustrating the method for manufacturing the optical connector of the second embodiment taken along line H-H in FIG. 17B.
Figure 17B:
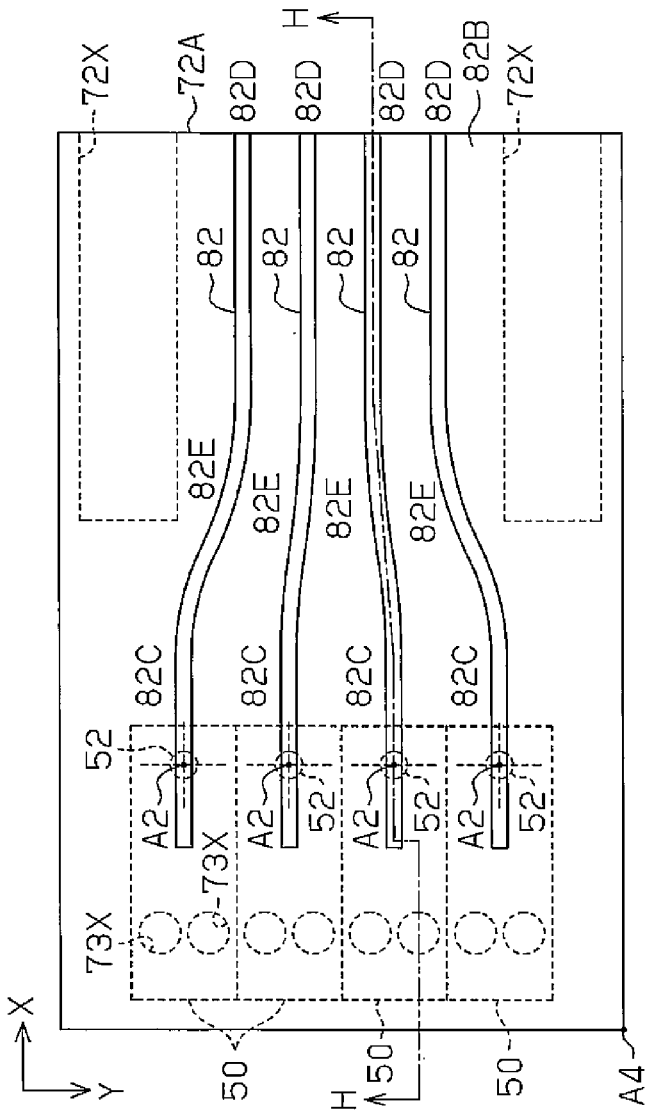
FIG. 17B is a schematic plan view of the optical connector of FIG. 17A.

Subsequently, in the step (third step) shown in FIGS. 17A and 17B, the core layer 82A is patterned to form the cores 82 with a predetermined shape based on the design data through the same manufacturing step as shown in FIGS. 8A to 8C. In the present example, as shown in FIG. 17B, a plurality of (four which is the same number as the channels) strip-shaped cores 82 each including the first portion 82C, the second portion 82D, and the third portion 82E are arranged in the Y-direction. For example, the core layer 82A is selectively irradiated at predetermined positions (positions where the cores 82 are to be formed) with active energy beams or electron beams based on the design data. This forms the cores 82 with a predetermined shape. In detail, the cores 82 are formed based on the design data in a manner that the optical axis center A2 of each optical element 50 and the first portion 82C of the corresponding core 82 overlap as viewed from above and the second portion 82D of each core 82 is formed at a position determined by, for example, the standard specifications of the MT connector. The cores 82 are patterned by detecting the corner A4 of the case 70 using, for example, a CCD camera and the coordinates of each optical axis center A2, and the corner A4 is set as the reference point. This allows the cores 82 to be patterned in a manner that the planar position of each optical axis center A2 conforms to the planar position of the corresponding core 82.

For example, the parts of the core layer 82A irradiated with active energy beams or electron beams function as the cores 82, and the parts of the core layer 82A that have not been radiated with active energy beams nor electron beams function as the clad portions 82B. Thus, each clad portion 82B is formed between adjacent cores 82.

In this manner, the cores 82 are formed by irradiating the core layer 82A with, for example, active energy beams. Thus, the setting of the irradiation pattern (irradiation positions) with the active energy beams for the core layer 82A based on the design data using the corner A4 as the reference point enables the cores 82 with a desirable planar shape to be formed at desirable planar positions.

In the step shown in FIG. 18A, the second clad layer 83 is formed to cover the cores 82. The steps described above yield the optical waveguide 80 including the cores 82 surrounding the first clad layer 81 and the second clad layer 83 on the lower surface 70A of the case 70.

In the step (fourth step) shown in FIG. 18B, the groove 84, which has a substantially regular triangular cross-section, and the reflective mirror 85 are formed at predetermined positions of the optical waveguide 80 based on the design data through the same manufacturing step as illustrated in FIGS. 10A and 10B. For example, the reflective mirror 85 is formed at the position overlapping the positions of the optical axis centers A2 of the mounted optical elements 50 as viewed from above, and the corner A4 detected by, for example, a CCD camera is set as the reference point.

As described above, the cores 82 and the reflective mirror 85 are formed at positions determined in accordance with the actual positions of the optical elements 50 accommodated in the case 70. Thus, the cores 82 and the reflective mirror 85 may be formed after accurate alignment with the optical elements 50. For example, the light emitting-receiving unit 52 of each optical element 50 accommodated in the case 70 is arranged immediately above the reflective mirror 85 so that the Y-coordinate of the optical axis center A2 of each optical element 50 substantially conforms to the Y-coordinate of the center of the first portion 82C of the corresponding core 82 in the width direction. This enables the optical elements 50 to be optically coupled with the optical waveguide 80 (cores 82) on which the reflective mirror 85 has been formed, while reducing misalignment between the optical axes of the optical element 50 and the cores 82 or the reflective mirror 85. This reduces optical coupling loss.

In the step shown in FIG. 19A, the openings 80X, which extend through the optical waveguide 80 and communicate with the through-holes 73X of the recess 73, are formed. The openings 80X may be formed by laser processing using, for example, a CO2 laser or a UV-YAG laser. When the first clad layer 81 and the second clad layer 83 are formed from a photosensitive resin, the openings 80X may be formed by, for example, photolithography.

In the step shown in FIG. 19B, the electrode terminals 51 are formed on the electrode pads 54 (not shown), which are exposed through the through-holes 73X and the openings 80X. The manufacturing steps described above yield the optical connector 2 shown in FIGS. 12A and 12B.

A method for manufacturing the optical module 1A will now be described.

Figures 20A, 20B:
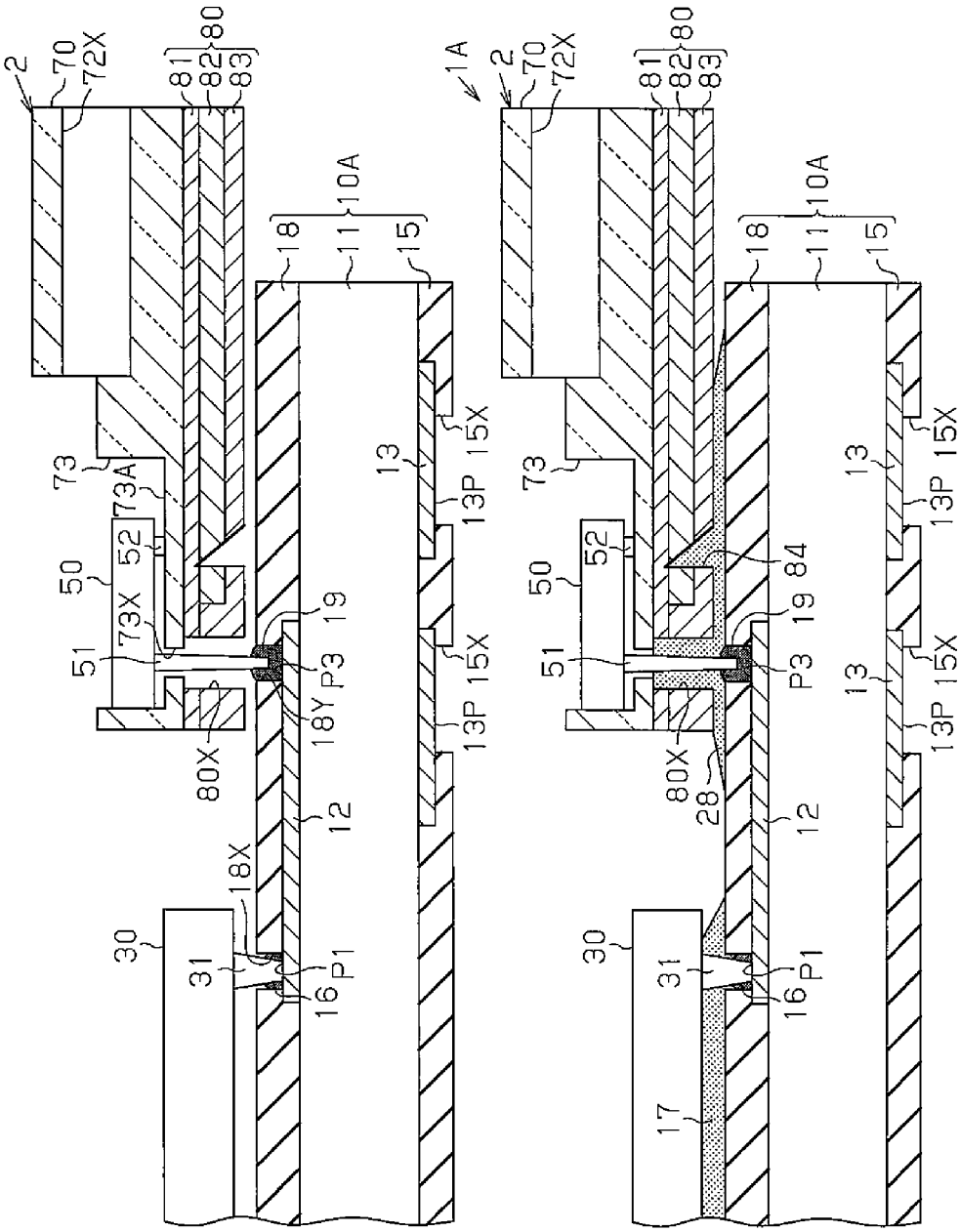
FIGS. 20A and 20B are schematic cross-sectional views illustrating the method for manufacturing the optical module of the second embodiment.
Figure 21:
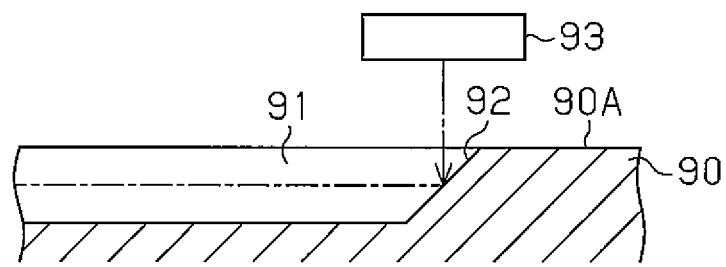
FIG. 21 is a schematic view showing a referential example of optical coupling between a light emitting element and an optical waveguide.

In the step shown in FIG. 20A, the wiring substrate 10A is prepared. The wiring substrate 10A may be prepared through, for example, the same manufacturing steps as illustrated in FIG. 5A to FIG. 7A. In detail, the predetermined wiring patterns 12 and 13 are formed on two sides of the substrate body 11. Subsequently, the solder resist layer 18 including the openings 18X, which allow parts the wiring pattern 12 to be exposed and function as the connecting pads P1 and P3, are formed on the upper surface of the substrate body 11. The solder resist layer 15 including the openings 15X, which allow parts of the wiring pattern 13 to be exposed and function as the external connecting pads 13P, is formed on the lower surface of the substrate body 11. Subsequently, the solder portions 16 and 19 are formed on the connecting pads P1 and P3, which are exposed through the openings 18X and 18Y of the solder resist layer 18.

In the step shown in FIG. 20A, the electrode terminals 31 of the electronic component 30 are aligned with the connecting pads P1 of the wiring substrate 10A. The solder portions 16 are then melted to electrically connect the electrode terminals 31 of the electronic component 30 to the connecting pads P1. This completes the flip-chip mounting of the electronic component 30 on the wiring substrate 10A.

In the step shown in FIG. 20A, the electrode terminals 51 of the optical elements 50 accommodated in the case 70 are aligned on the connecting pads P3 of the wiring substrate 10A. The solder portions 19 are then melted to electrically connect the electrode terminals 51 of the optical elements 50 to the connecting pads P3. This completes the mounting of the optical connector 2 on the wiring substrate 10A.

In the step shown in FIG. 20B, the underfill resin 17 is filled between the wiring substrate 10A and the electronic component 30. The underfill resin 28 is also filled between the wiring substrate 10A and the optical connector 2. The underfill resin 28 also fills the openings 80X and the groove 84.

The manufacturing steps described above yield the optical module 1A shown in FIG. 14.

The second embodiment has the advantages described below in addition to the advantages (1) to (4) of the first embodiment.

(5) The optical waveguide 80 (cores 82) is stacked (integrated) on the case 70 in which the optical elements 50 are fixed. Thus, the reference point (e.g., the corner A4 of the case 70) used to detect the position of the optical axis center A2 of each optical element 50 may also be used as the reference point for forming the cores 82 and the reflective mirror 85. This reduces deviations between the reference point used to detect the optical axis center A2 and the reference point used to form the cores 82 and the reflective mirror 85, and thereby reduces misalignment between the optical axes of the optical element 50 and the cores 82 or the reflective mirror 85.

It should be apparent to those skilled in the art that the present invention may be embodied in many other specific forms without departing from the spirit or scope of the invention. Particularly, it should be understood that the present invention may be embodied in the following forms.

The underfill resins 17, 27, and 28 may be eliminated.

The optical modules 1 and 1A may include any number of channels.

The cores 22 do not have to be linear as viewed from above and may each include, for example, a curved portion, a branching portion, or an intersecting portion. Alternatively, the cores 22 may include a light collecting portion (e.g., part with a narrower width than other parts) or a light diffusing portion (e.g., part with a wider width than other parts).

The reflective mirrors 25 and 85 function as optical path changing units that change the direction of an optical path of incident light. In another embodiment that does not use the reflective mirrors 25 and 85, an air layer defined on the inclined surfaces 24A and 84A of the grooves 24 and 84 may function as an optical path changing unit that changes an optical path of incident light by 90 degrees.

In the above embodiments, the grooves 24 and 84 having the inclined surfaces 24A and 84A are formed on the optical waveguides 20 and 80, and the reflective mirrors 25 and 85 are formed on the inclined surfaces 24A and 84A. Alternatively, for example, a mirror supporter having an inclined surface may be formed on the upper surface of the substrate body 11 (or on the lower surface 70A of the case 70), and an optical waveguide may be formed to cover the mirror supporter.

In the second embodiment, the guide holes 72X formed in the connector portion 72 of the case 70 may be eliminated.

In the above embodiments, the direct imaging (maskless) exposure apparatus selectively irradiates the core layers 22A and 82A at positions where the cores 22 and 82 are to be formed with active energy beams or electron beams. Alternatively, for example, a mask having a pattern with openings corresponding to the cores 22 and 82 may be used. In this case, the core layers 22A and 82A are selectively irradiated with active energy beams or electron beams through the mask.

Alternatively, the cores 22 and 82 may be formed by photolithography. For example, a resist layer may be formed on the first clad layers 21 and 81, and the resist layer may be exposed and developed to have a pattern corresponding to the cores 22. The developed parts (recesses) of the resist layer may then be filled with a material for forming the cores 22. This forms the cores 22. Setting the positions of light illumination during an exposure process by using the alignment marks M1 or the corner A4 as the reference point enables this modification to have the same advantages as described in the above embodiments.

The cases 40 and 70 may have any shape that allows a plurality of optical elements to be accommodated in the cases.

The disclosure further encompasses various examples described below.

Clause 1. A method for manufacturing an optical module, the method comprising:
preparing a case including an accommodation portion in which a plurality of optical elements are accommodated and fixed;
detecting planar positions of a plurality of optical axis centers of the plurality of optical elements in a plane including a certain point of the case serving as a reference point;
forming an optical waveguide including a plurality of optical waveguide cores and a clad layer surrounding the optical waveguide cores based on the detected planar positions of the optical axis centers; and
forming an optical changing unit that faces the optical waveguide at a predetermined angle based on the detected planar positions of the optical axis centers.

Clause 2. The method according to Clause 1, further comprising:
forming a wiring substrate including a wiring pattern;
forming an alignment mark corresponding to the reference point; and
mounting the case onto the wiring substrate, wherein the mounting includes aligning the certain point of the case with the alignment mark, and connecting electrode terminals of the optical elements accommodated in the case to the wiring pattern, and
wherein forming the optical waveguide includes
stacking the optical waveguide on the wiring substrate, and
patterning the optical waveguide cores based on the planar positions of the optical axis centers when the alignment mark is set at the certain point, and
forming the optical path changing unit includes forming the optical path changing unit based on the planar positions of the optical axis centers when the alignment mark is set at the certain point.

Clause 3. The method according to Clause 1, wherein forming the optical waveguide includes stacking the optical waveguide on one surface of the case, the method further comprising:
forming a wiring substrate including a wiring pattern; and
mounting the case on the wiring substrate, wherein the mounting includes connecting, to the wiring pattern, electrode terminals of the optical elements in the case on which the optical waveguide has been stacked.

Clause 4. The method according to Clause 1, wherein forming the optical waveguide includes patterning the optical waveguide cores with a direct imaging exposure apparatus.

The present examples and embodiments are to be considered as illustrative and not restrictive, and the invention is not to be limited to the details given herein, but may be modified within the scope and equivalence of the appended claims.

The invention claimed is:
1. An optical module comprising:
a case including an accommodation portion;
a plurality of optical elements accommodated in and fixed to the accommodation portion of the case, wherein the optical elements have optical axis centers;

a plurality of optical waveguide cores respectively formed at positions corresponding to planar positions of the optical axis centers;

a clad layer surrounding the optical waveguide cores, wherein the clad layer and the optical waveguide cores form an optical waveguide;

a wiring substrate including a wiring pattern to which electrode terminals of the optical elements are connected, wherein the optical waveguide is stacked on the wiring substrate, and the case is mounted on the wiring substrate on which the optical waveguide has been stacked; and an optical path changing unit formed at a position corresponding to the planar positions of the optical axis centers, wherein the optical path changing unit faces the optical waveguide at a predetermined angle;

wherein the optical elements are accommodated in the accommodation portion with adjacent ones of the optical elements in contact with each other.

2. The optical module according to claim 1, further comprising an alignment mark used to align a reference point with a desirable position when mounting the case on the wiring substrate.

3. The optical module according to claim 1, wherein the optical waveguide is stacked on one surface of the case.

4. The optical module according to claim 3, further comprising a wiring substrate including a wiring pattern to which electrode terminals of the optical elements are connected, wherein the case on which the optical waveguide has been stacked is mounted on the wiring substrate.

5. The optical module according to claim 1, wherein the optical elements are an array of light emitting elements and light receiving elements that are arranged alternately, and the array is accommodated in the accommodation portion.

6. An optical module comprising:

an optical element assembly including a case, a plurality of optical elements fixed to the case, and a reference point, wherein the optical elements are aligned with the reference point and have optical axes respectively directed to different positions on a plane including the reference point of the optical element assembly;

an optical waveguide that supports the optical element assembly, wherein the optical waveguide includes a plurality of optical waveguide cores, a clad layer, and a groove, the optical waveguide cores respectively correspond to the optical elements of the optical element assembly, the clad layer surrounds the optical waveguide cores, and the groove traverses the optical waveguide cores; and an optical path changing unit including an inner surface of the groove of the optical waveguide, wherein the optical path changing unit is inclined to the optical axes and the optical waveguide cores, wherein the optical waveguide includes an alignment mark that is aligned with the reference point of the optical element assembly, and wherein the optical elements are accommodated in the accommodation portion with adjacent ones of the optical elements in contact with each other.

* * * * *